United States Patent [19]

Thomas

[11] Patent Number: 5,581,252
[45] Date of Patent: Dec. 3, 1996

[54] ANALOG-TO-DIGITAL CONVERSION USING COMPARATOR COUPLED CAPACITOR DIGITAL-TO-ANALOG CONVERTERS

[75] Inventor: David M. Thomas, Los Altos, Calif.

[73] Assignee: Linear Technology Corporation, Milpitas, Calif.

[21] Appl. No.: 322,430

[22] Filed: Oct. 13, 1994

[51] Int. Cl.$^6$ .................................................. H03M 1/46
[52] U.S. Cl. ........................... 341/144; 341/155; 341/172
[58] Field of Search .................................... 341/144, 155, 341/134, 150, 172, 110, 120, 121

[56] References Cited

U.S. PATENT DOCUMENTS 4,764,763  8/1988  Yukawa ..................................... 340/347
4,947,169  8/1990  Smith ........................................ 341/121

OTHER PUBLICATIONS

"All–MOS Charge Redistribution Analog–to–Digital Conversion Techniques—Part 1," J. McCreary and P. Gray, *IEEE Journal of Solid–State Circuits*, vol. SC–10, No. 6, Dec. 1975, pp. 371–379.

"Error Correction Techniques for High–Performance Differential A/D Converters," Khen–Sang Tan et al., *IEEE Journal of Solid–State Circuits*, vol. 25, No. 6, Dec. 1990, pp. 1318–1327.

"The Linear Seminar for Designers by Designers," An Application Seminar for Potential Customers given on Nov. 28, 1990 by William C. Rempfer of Linear Technology Corporation, Milpitas, California, pp. i, 41.

"ADC08131/ADC08134/ADC08138 8–Bit High–Speed Serial I/O A/D Converters with Multiplexer Options, Voltage Reference, and Track/Hold Function," *National Semiconductor Data Acquisition Data Book*, 1993 Edition, National Semiconductor Corporation, pp. 2–111 to 2–129.

"ADC10731/ADC10732/ADC10734/ADC10738 10–Bit Plus Sign Serial I/O A/D Converters with Mux, Sample/Hold and Reference," Advance Information from *National Semiconductor Data Acquisition Data Book*, 1993 Edition, National Semiconductor Corporation, pp. 2–415.

"ADC10831,ADC10832,ADC10834,ADC10838 10–Bit Plus Sign Serial I/O A/D Converters with Mux, Sample/Hold and Reference," Advance Information from *National Semiconductor Data Acquisition Data Book*, 1993 Edition, National Semiconductor Corporation, pp. 2–416.

"HI5813 CMOS 3.3V, 25us 12–Bit Sampling A/D Converter with Internal Track and Hold," *Data Acquisition 1994*, Harris Semiconductor Corporation, Copyright 1993, pp. 5–79 to 5–90.

"HI5812 CMOS 12–Bit Sampling A/D Converter with Internal Track and Hold," *Harris Semiconductor Data Sheet*, Harris Semiconductor Corporation, Jul. 1992, pp. 1–16.

"TLC1125 Self–Calibrating 12–Bit–Plus–Sign Analog–to–Digital Converter," *Linear Circuits Data Book*, vol. 2, Texas Instruments Corporation, 1992, pp. 5–3 to 5–14.

"ADC774 Microprocessor–Compatible Analog–to–Digital Converter," *Burr–Brown integrated circuits data book supplement*, vol. 33c, Burr–Brown Corporation, pp. 9.1.15 to 9.1.24.

"Complete 12–Bit A/D Converter AD574A," *Data Converter Reference Manual*, 1992, vol. II, Analog Devices Corporation, pp. 2–41 to 2–51.

*Primary Examiner*—Jeffrey A. Gaffin
*Assistant Examiner*—Peguy JeanPierre
*Attorney, Agent, or Firm*—Fish & Neave; Jonathan T. Kaplan; Robert W. Morris

[57] ABSTRACT

An analog-to-digital converter circuit (ADC) is described which comprises capacitor based digital-to-analog converter circuits (CDACs) coupled to the inputs of a voltage comparator wherein a reference voltage of one CDAC section has been scaled with respect to a reference voltage of another CDAC section such that one CDAC section adds additional resolution to the other CDAC section. The invention may be applied to single input ADCs as well as to differential ADCs with either type operating in either unipolar or bipolar mode. Also described are various known approaches to both single input and differential CDAC-based successive approximation ADCs, as well as a novel technique of capacitive input voltage attenuation for differential ADCs.

22 Claims, 10 Drawing Sheets

ANALOG-TO-DIGITAL CONVERSION USING COMPARATOR COUPLED CAPACITOR DIGITAL-TO-ANALOG CONVERTERS

This invention relates to analog-to-digital converters (ADCs). More particularly, the present invention relates to ADCs comprising capacitor digital-to-analog converters, or CDACs, for converting analog signals to digital signals by any one of several known methods, such as the successive approximation method.

BACKGROUND OF THE INVENTION

ADCs which utilize CDACs, and in particular ADCs which utilize CDACs to convert analog signals to a digital signal are known. ADCs typically are classified according to two parameters: (i) whether the ADC can monitor only a single analog input at any one time (a single input ADC) or whether the ADC can continuously monitor differential inputs (a differential input ADC), and (ii) the internal architecture of the ADC. Two known ADC internal architectures may be referred to as "single ended" and "differential." A single ended ADC architecture means that the ADC has one feedback path to a single CDAC which is coupled to only one of the analog inputs of the ADC's voltage comparator. A differential ADC architecture means that the ADC has two parallel feedback paths (parallel in the sense that they always transmit the same feedback information at the same time) coupled to individual CDACs with one CDAC being connected to the positive input of the ADC's voltage comparator and the other CDAC being connected to the negative input of the ADC's voltage comparator.

Single input ADCs have a single analog input whose signal is measured against a fixed voltage level which is typically ground. ADCs with differential inputs measure the difference between the voltages at the two inputs.

Based upon the above described parameters, the following classifications of ADCs are known: the use of a single-ended architecture to implement a single input ADC, the use of a differential architecture to implement an ADC with a single input, and the use of a differential architecture to implement an ADC with differential inputs.

Known techniques for implementing a single input ADC with a single-ended architecture may result in the occurrence of least two known problems: (1) injection of an error charge into the output signal of the CDAC, and (2) a prohibitively large ratio of the most significant bit (MSB) capacitor to the least significant bit (LSB) capacitor for high resolution ADCs. Several attempts to resolve these deficiencies have been made. For example, the injected error charge may be balanced by providing a "dummy" capacitor array coupled to the normally grounded comparator input. The dummy array results in similar error charges being injected into both inputs of the comparator, in which case, the common mode rejection of the comparator acts to reduce the effects of the error charge.

The deficiency related to the prohibitively large ratio of MSB capacitor to LSB capacitor may be reduced by coupling part of the CDAC's capacitor array to the output of the CDAC through a scaling capacitor. For example, a twelve bit ADC (having twelve capacitors) normally requires that the largest capacitor be $2^{11}$ times greater in size than the smallest capacitor. Coupling a scaling capacitor between the output and, for example, six of the capacitors reduces this requirement to $2^5$ greater than the smallest capacitor (because the two groups of six capacitors may be scaled as individual DACs).

However, both of these known solutions may cause other problems. For instance, a dummy capacitor array consumes the same amount of die area, on an integrated circuit, as the capacitor array of the actual CDAC since the dummy array must have the same layout to properly offset the error charge. Also, the capacitance of the scaling capacitor may be significantly affected by the parasitic capacitance of an integrated circuit layout. This may make it difficult to predictably ratio the capacitors coupled to the output of the CDAC through the scaling capacitor with respect to those capacitors which are not coupled to the output of the CDAC through the scaling capacitor. An error in ratioing may result in a differential linearity error for the CDAC at the transition between those capacitors which are and are not coupled to the CDAC's output through the scaling capacitor.

Known implementations of both single input and differential input ADCs with a differential architecture also suffer from at least three known deficiencies: (1) differential ADCs consume twice the die area, for the CDAC portion, compared to a single-ended implementation of a single input ADC (without a dummy array) because two CDACs with identical capacitor arrays are typically required, (2) a prohibitively large ratio of MSB capacitor to LSB capacitor for high resolution ADCs, and (3) additional circuitry is required to cancel the common mode voltage (CMV) to within the common mode range (CMR) of the ADC's voltage comparator. The CMR of a voltage comparator is defined to be the range of input voltages which, when applied to both inputs, will not cause gain degradation.

There are no known solutions for the large die area consumed by ADCs, of either the single input or differential input type, implemented with a differential architecture.

As with known single input ADCs implemented with a single-ended architecture, the prohibitively large ratio of MSB capacitor to LSB capacitor may be reduced by coupling part of the capacitor array of each CDAC to the output of the respective CDAC through scaling capacitors. Unfortunately, as described above, the capacitance of the scaling capacitor may be significantly affected by the parasitic capacitance of an integrated circuit layout making it difficult to predictably ratio the capacitors for each CDAC capacitor array.

In view of the foregoing, it would be desirable to provide an improved analog-to-digital converter circuit using comparator coupled capacitor digital-to-analog converter circuits that require reduced die area.

It would be further desirable to provide an improved high resolution analog-to-digital converter circuit using CDACs which avoids the affects of parasitic capacitance on scaling capacitors.

It would further be desirable to provide an improved analog-to-digital converter circuit using CDACs, of certain ADC categories, that uses simple circuitry to reduce the CMV to be within the CMR of the voltage comparator.

It would further be desirable to apply simple circuitry, for reducing the CMV of an ADC to within the CMR of its voltage comparator, to the dummy CDAC of an ADC with a single input and a single-ended architecture to achieve an ADC with differential inputs.

It would further be desirable to provide an improved analog-to-digital converter circuit using CDACs, of certain ADC categories, that uses simple circuitry to achieve bipolar operation.

SUMMARY OF THE INVENTION

In view of the foregoing, it is an object of the present invention to provide an improved analog-to-digital converter circuit using comparator coupled capacitor digital-to-analog converter circuits that requires reduced die area.

It is a further object of the present invention to provide an improved high resolution analog-to-digital converter circuit using CDACs which avoids the affects of parasitic capacitance on scaling capacitors.

It is a further object of the present invention to provide improved analog-to-digital converter circuits using CDACs, of certain ADC categories, that uses simple circuitry to reduce the CMV to be within the CMR of the voltage comparator.

It is a further object of the present invention to apply simple circuitry, for reducing the CMV of an ADC to within the CMR of its voltage comparator, to the dummy CDAC of an ADC with a single input and a single-ended architecture to achieve an ADC with differential inputs.

It is a further object of the present invention to provide an improved analog-to-digital converter circuit using CDACs, of certain ADC categories, that uses simple circuitry to achieve bipolar operation.

These, and other objects of the present invention, are accomplished by an improved analog-to-digital converter (ADC) circuit. The circuit includes a comparator coupled capacitor digital-to-analog converter (CDAC) which provides high data resolution while maintaining a relatively low capacitor size ratio between the LSB capacitor and the MSB capacitor. The circuit achieves a low MSB to LSB capacitor size ratio by partitioning the CDAC into two sections, an MSB section and an LSB section, which are applied to separate inputs of a comparator. If the partitioning is into two substantially equal sections, the two sections each cause a substantially equal error charge to be injected into their respective output signals, thereby balancing the injected error charge without increasing die area.

In addition, the two sections of the CDAC are each supplied by one of two reference voltages which have been appropriately scaled with respect to each other such that the second CDAC section adds resolution to the first CDAC section. Scaling the reference signals enables the circuit to utilize multiple sets of capacitors with smaller MSB to LSB capacitor size ratios without having to rely on scaling capacitors. Therefore, potential problems related to parasitic capacitance on scaling capacitors are avoided. The two sections may be driven by two different input signals, in differential mode, or by a single input signal (where the remaining input signal is grounded).

The above described circuits can be operated by a control unit such that the comparator approximates the difference between the first and second analog inputs as a digital value. Typically, the control unit first approximates the difference between the first and second analog inputs by operating the first CDAC section in conjunction with the voltage comparator. Secondly, the control unit approximates the difference between the first and second analog inputs to a greater resolution by operating the second CDAC section in conjunction with the voltage comparator. The approximation may be performed by any one of several known methods, such as the successive approximation procedure.

The present invention extends the above-described ADC classification scheme by introducing a third category of internal architecture, the "comparator coupled CDAC" architecture. This architecture can implement either single input or differential input ADCs.

The present invention reduces the CMV to within the CMR of the voltage comparator, by sampling the input signal on less than all the capacitors of at least one of the ADC's CDACs.

The present invention achieves bipolar operation by utilizing CDAC capacitors which are controlled by SAR bits but which are not utilized for sampling the input signal.

The present invention therefore extends the categories of ADCs to include at least the following: single input single-ended architecture (SISA), differential input single-ended architecture (DISA), single input differential architecture (SIDA), differential input differential architecture (DIDA), single input comparator coupled CDAC architecture (SICA) and differential input comparator coupled CDAC architecture (DICA).

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

BACKGROUND

A capacitor based digital to analog converter circuit (CDAC) is the basic element in many analog to digital converter circuit (ADC) designs. In particular, CDACs are commonly used in successive approximation ADCs. Successive approximation ADCs systematically evaluate the analog input signal in N steps to produce an N-bit digital code. The analog signal is successively compared to the CDAC output to determine the digital code, beginning with the determination of the most significant bit and progressing until the least significant bit is determined. In each successive comparison, the analog signal is compared to the CDAC's output resulting from the previously approximated bits plus the bit we are currently testing where the current bit is kept at 1 only if the CDAC's output is less than the analog signal.

Figure 1:
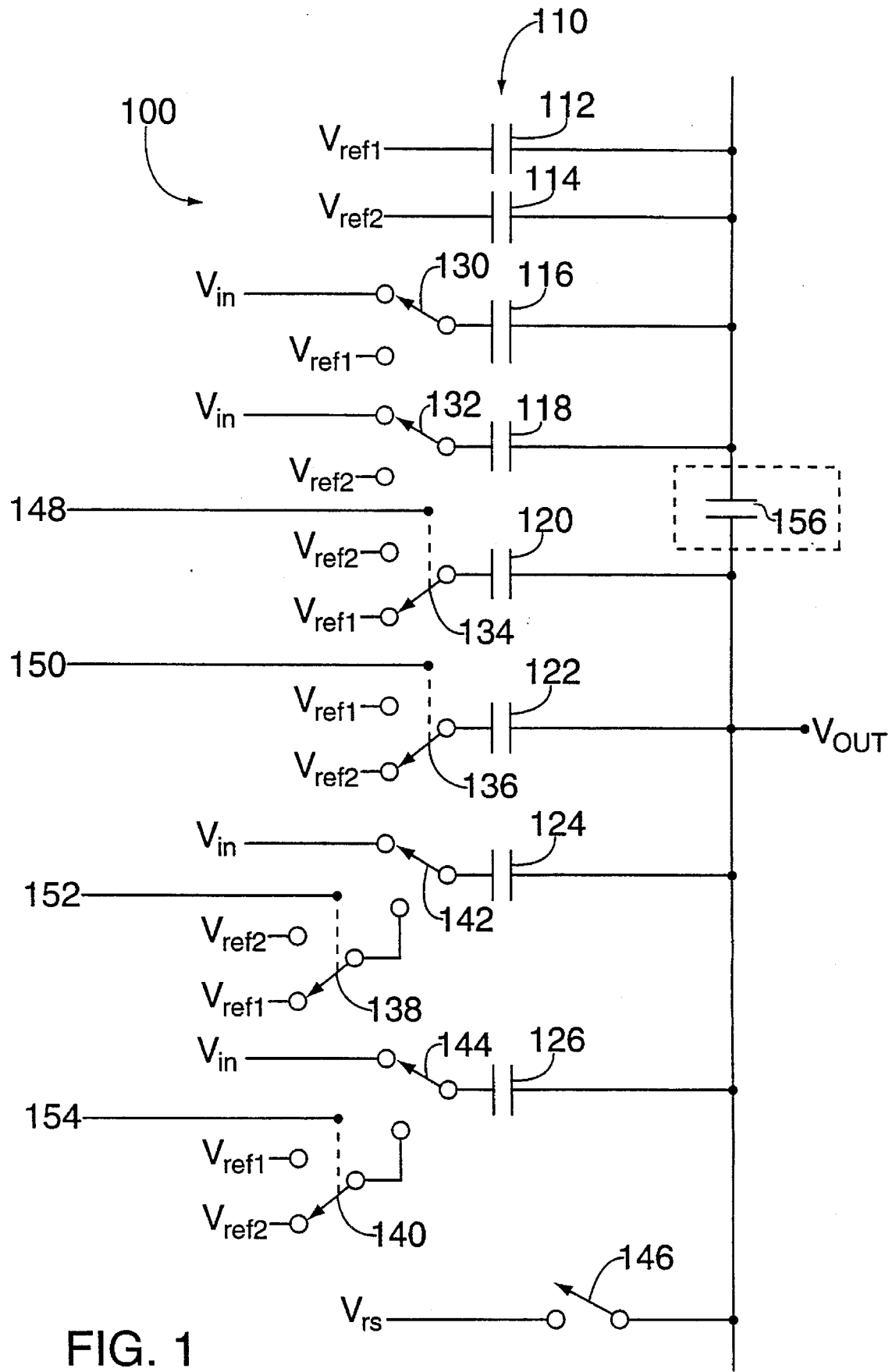
FIG. 1 is a schematic diagram illustrating several general circuit configurations which may be used, separately or in combination, in order to design particular CDACs.

FIG. 1 illustrates the structure of a general CDAC circuit 100. CDAC 100 includes a capacitor array 110 (including capacitors 112–126) comprising capacitors in one or more configurations, as is discussed below. Each capacitor has a first plate coupled to an output node Vout and a second plate coupled to a reference voltage (e.g., Vref1, Vref2) or an input voltage Vin. The second plate may be directly coupled to the selected voltage (e.g., capacitors 112 and 114) or it may be coupled to select among multiple voltages by a switch, as shown by capacitors 116–126 and switches 130–144.

CDAC 100 further includes a sampling switch 146 coupled between fixed reference voltage Vrs and Vout. Additionally, digital input nodes 148–154, which are designated $b_0, b_1, \ldots b_{q-1}$ (the subscript indicating increasing significance from the least significant bit (LSB) to the most significant bit (MSB)), provide the control signals to switches 134–140. While the number of input nodes, referred to as q, varies with given applications, in CDAC 100, q is equal to 4. Some, or all, of the capacitors in capacitor array 110 may be coupled to Vout through a scaling capacitor 156, which is optional as indicated by the dashed box.

For the purposes of clarity in the following discussion, some simplifications have been made. In general, a CDAC may contain more than three different voltage references, with each reference being any positive voltage, negative voltage, or gnd. In this application of CDACs to ADCs, CDAC 100 has only three different references Vref1, Vref2, and Vrs. Further generalization of the following equations to handle more than three voltage references should be obvious to one of ordinary skill in the art. It should be noted that Vrs could be driven, through an appropriate network, by feedback from the ADC's voltage comparator. In this case the feedback would be taken from either the output of a non-latching voltage comparator or from before the latch in a latching voltage comparator.

CDAC 100 has two main modes of operation: sampling mode (during which Vrs is set as the initial condition for Vout with a particular acquired voltage on Vin) and hold mode (during which Vout is varied from Vrs by CDAC 100's digitally controlled capacitive voltage divider). Sampling mode is initiated by closing sampling switch 146 and by switching at least one of 130, 132, 142 or 144 to Vin. Hold mode is initiated by opening sampling switch 146 and by switching, away from Vin, all of switches 130, 132, 142 and 144.

During sampling mode Vout is clamped to Vrs through sampling switch 146. At the instant sampling switch 146 is opened, provided that the voltages (including Vin) remain constant at the side of each capacitor not connected to Vout (this side shall be referred to as the bottom plate or BP), Vout remains at voltage Vrs. Thereafter, any change in the voltage on any BP produces a change at Vout in accordance with the equations for a capacitive voltage divider.

Vs is the voltage change which would result at Vout, during hold mode, if a certain set of capacitors (called Cs) had their BPs switched from Vin to Vref1. Vsw(y) consists of two parts: a bit pattern y which is applied to the CDAC's digital inputs during sampling but becomes zero during hold mode, and a certain set of capacitors (called Csw(y) ) that have their BPs connected to Vref2 during sampling. Vsw(y) is the voltage change which would result at Vout if the capacitors of Csw(y) had their BPs switched from Vref2 during sampling to Vref1 during hold. Vd(w) also consists of two parts: a bit pattern w applied to the CDAC's digital inputs which is zero during sampling and then becomes of value w during hold mode, and a certain set of capacitors (called Cd(w)) which have their BPs connected to Vref2 during hold mode. Vd(w) is the voltage change which would result at Vout if the capacitors of Cd(w) had their BPs switched from Vref1 during sampling to Vref2 during hold. The total voltage at the Vout during hold mode (Vthold) is then:

$$Vthold = Vrs + Vs + Vsw(y) + Vd(w) \quad (1)$$

As is discussed further below, some (or all) of the capacitors may be coupled to Vout through scaling capacitor 156, which is an example of how a scaling capacitor may be added to CDAC 100. The equivalent lumped capacitance of each of capacitors 112–118, from the perspective of Vout, is obtained by multiplying the capacitance of each by the following scaling factor:

$$C_{156}/(C_{156}+C_{112}+C_{114}+C_{116}+C_{118}) \quad (2)$$

The eight basic configurations for coupling the capacitors in capacitor array 110 are distinguished by the switching network which may be coupled to each capacitor's second plate, which has been referred to above as the "bottom plate" (or BP). These eight configurations are as follows, as shown in FIG. 1.

The first two configurations are related by the fact that their BPs are always at a constant voltage level and that no switching network is connected to the capacitors. Configuration Cg, as shown by capacitor 112, has its BP always coupled to Vref1. Configuration Cv, as shown by capacitor 114, has its BP always coupled to Vref2.

The next two configurations, Csg, as shown by capacitor 116, and Csv, as shown by capacitor 118, are similar in that their BPs are coupled to Vin during sampling mode through switches 130 and 132, respectively. The two configurations are distinguished by fact that Csg has its BP coupled to Vref1 during hold mode, while Csv has its BP coupled to Vref2 during hold mode.

Configurations $Cwg_i$, capacitor 120, and $Cwv_i$, capacitor 122, have their BPs coupled to single pole double throw switches 134 and 136, respectively, which can couple the capacitor's BP to either Vref1 or Vref2 in response to one of the input bits. The subscript "i" is used to refer to a selected one of the input bits $b_0$–$b_{q-1}$. For $Cwg_i$, the BP of capacitor 120 is coupled to Vref1 when input bit $b_i=0$ and to Vref2 when input bit $b_i=1$. For $Cwv_i$, the BP of capacitor 122 is coupled to Vref2 when input bit $b_i=0$ and to Vref1 when input bit $b_i=1$.

Configurations $Cbg_i$, capacitor 124, and $Cbv_i$, capacitor 126, both have switching networks which couple their BPs to Vin (i.e., the analog input) during sampling mode through switches 142 and 144 respectively. During hold mode, the BPs of capacitors 124 and 126 are coupled to either Vref1 or Vref2 in response to the value of their input bit $b_i$. For $Cbg_i$ the BP, during hold mode, is coupled to Vref1 when $b_i=0$ and to Vref2 when $b_i=1$. For $Cbv_i$ the BP, during hold mode, is coupled to Vref2 when $b_i=0$ and to Vref1 when $b_i=1$.

Each of the described configurations may be used in the construction of a CDAC. In order to define general CDAC equations it is necessary to divide the input bits into four disjoint groups with the number of bits in each group being t, s, r and p. Four groups of input bits are defined because there are up to four different configurations of capacitors whose BPs may be switched between Vref1 or Vref2 by a given input bit. Each number t, s, r and p is an integer $>=0$ and $<=q$. In addition: $t+s+r+p=q$ (i.e., the sum of t, s, r and p cannot exceed the number of input bits). For the sake of convenience, t is the number of capacitors of configuration $Cwg_i$, s is the number of capacitors of configuration $Cwv_i$, r is the number of capacitors of configuration $Cbg_i$, and p is the number of capacitors of configuration $Cbv_i$.

A(j), B(j), G(j) and D(j) are four functions which are used as a convenient way of describing the four arbitrary and disjoint groups of the input bits.

The four groups are:

A(1), A(2), ... A(t)

S(1), S(2), ... B(s)

G(1), G(2), ... G(r)

D(1), D(2), ... D(p)

Each of the functions A(j), B(j), G(j) and D(j) maps its input value j to a value $>=0$ and $<=q-1$.

The outputs of A(j), B(j), G(j) and D(j) are chosen to be disjoint with respect to each other. In other words, the functions A(j), B(j), G(j) and D(j) have no output values in common.

The four groups of capacitors are:

$Cwg_{A(1)}, Cwg_{A(2)}, \ldots Cwg_{A(t)}$ $Cwv_{B(1)}, Cwv_{B(2)}, \ldots Cwv_{B(s)}$ $Cbg_{G(1)}, Cbg_{G(2)}, \ldots Cbg_{G(r)}$ $Cbv_{D(1)}, Cbv_{D(2)}, \ldots Cbv_{D(p)}$ The total capacitance at Vout, or Ct, is:

$$Ct = [Cg + Cv + Csg + Csv + \quad (3)$$
$$Cwg_{A(1)} + Cwg_{A(2)} + \ldots Cwg_{A(t)} +$$
$$Cwv_{B(1)} + Cwv_{B(2)} + \ldots Cwv_{B(s)} +$$
$$Cbg_{G(1)} + Cbg_{G(2)} + \ldots Cbg_{G(r)} +$$
$$Cbv_{D(1)} + Cbv_{D(2)} + \ldots Cbv_{D(p)}]$$

Cs contains the set of all capacitors, of all types, whose BPs are connected to Vin during sampling:

$$Cs = [Csg + Csv + \quad (4)$$
$$Cbg_{G(1)} + Cbg_{G(2)} + \ldots Cbg_{G(r)} +$$
$$Cbv_{D(1)} + Cbv_{D(2)} + \ldots Cbv_{D(p)}]$$

The voltage change at Vout during hold mode which would result if all the BPs of the capacitors in Cs were switched to Vref1 is:

$$Vs=(Vref1-Vin)*(Cs/Ct) \quad (5)$$

Csw(y) contains the set of all capacitors connected to Vref2 during sampling when bit pattern y is applied:

$$Csw(y) = [Cv + \quad (6)$$
$$b_{A(1)}*Cwg_{A(1)} + b_{A(2)}*Cwg_{A(2)} +$$
$$\ldots b_{A(t)}*Cwg_{A(t)} +$$
$$NOT(b_{B(1)})*Cwv_{B(1)} + NOT(b_{B(2)})*Cwv_{B(2)} +$$
$$\ldots NOT(b_{B(s)})*Cwv_{B(s)}]$$

The voltage change at Vout during hold mode which would occur if the BPs of all the capacitors in Csw(y) were switched from Vref2 to Vref1 is:

$$Vsw(y)=(Vref1-Vref2)*(Csw(y)/Ct) \quad (7)$$

Cd(w) contains the set of all capacitors connected to Vref2 during hold mode when bit pattern w is applied:

$$Cd(w) = [Cv + Csv + \quad (8)$$
$$b_{A(1)}*Cwg_{A(1)} + b_{A(2)}*Cwg_{A(2)} + \ldots$$
$$b_{A(t)}*Cwg_{A(t)} + NOT(b_{B(1)})*Cwv_{B(1)} +$$
$$NOT(b_{B(2)})*Cwv_{B(2)} + \ldots NOT(b_{B(s)})*Cwv_{B(s)} +$$
$$b_{G(1)}*Cbg_{G(1)} + b_{G(2)}*Cbg_{G(2)} + \ldots$$
$$b_{G(r)}*Cbg_{G(r)} + NOT(b_{D(1)})*Cbv_{D(1)} +$$
$$NOT(b_{D(2)})*Cbv_{D(2)} + \ldots NOT(b_{D(p)})*Cbv_{D(p)}]$$

Vd(w) is the voltage change which would occur if all the BPs of all the capacitors in Cd(w) were switched from Vref1 to Vref2:

$$Vd(w)=(Vref2-Vref1)*(Cd(w)/Ct) \quad (9)$$

As discussed above, the total voltage at Vout during hold mode, Vthold, is defined by equation (1).

These equations presented above are intended to be general formulations and typically at least some of the capacitor configurations shown will not be used in a particular CDAC design.

Any (or all) of the above described capacitor configurations may be separated from Vout by a scaling capacitor $C_{scale}$, such as capacitor 156. Assume that a total of x capacitors (called $C_1, C_2, \ldots C_x$), of arbitrary configurations, have been coupled to Vout through $C_{scale}$. To utilize the general CDAC equations, as shown above, one would need to calculate the equivalent lumped capacitance of capacitors $C_1, C_2, \ldots C_x$. This may be accomplished by multiplying the capacitance of each of $C_1, C_2, \ldots C_x$ by the following scaling factor:

$$C_{scale}/(C_{scale}+C_1+C_2+\ldots C_x) \quad (10)$$

Figure 2A:
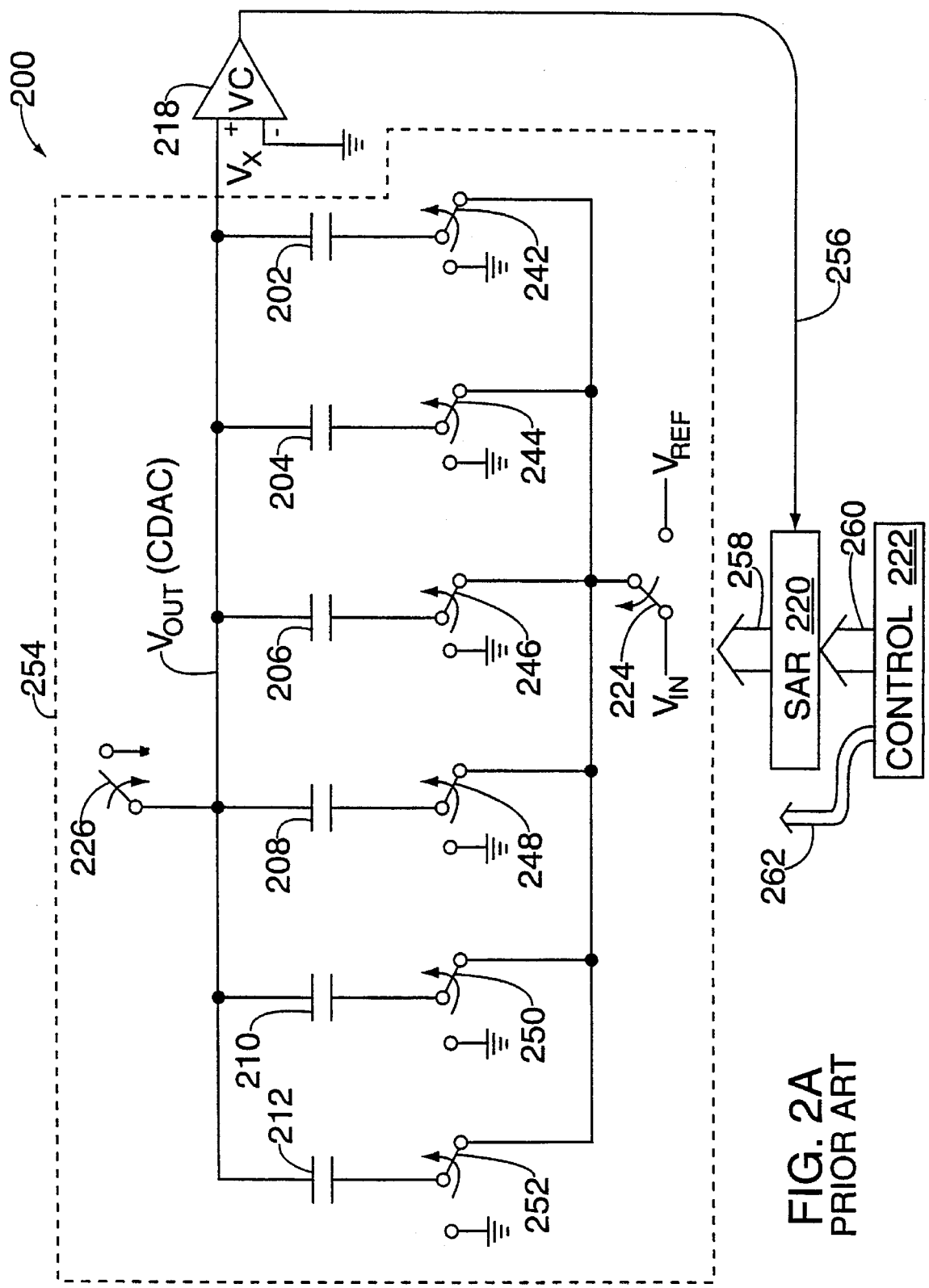
FIGS. 2A–2C, collectively referred to as FIG. 2, are schematic diagrams of a known CDAC-based single input ADC with a single-ended successive approximation architecture.
Figure 2B:
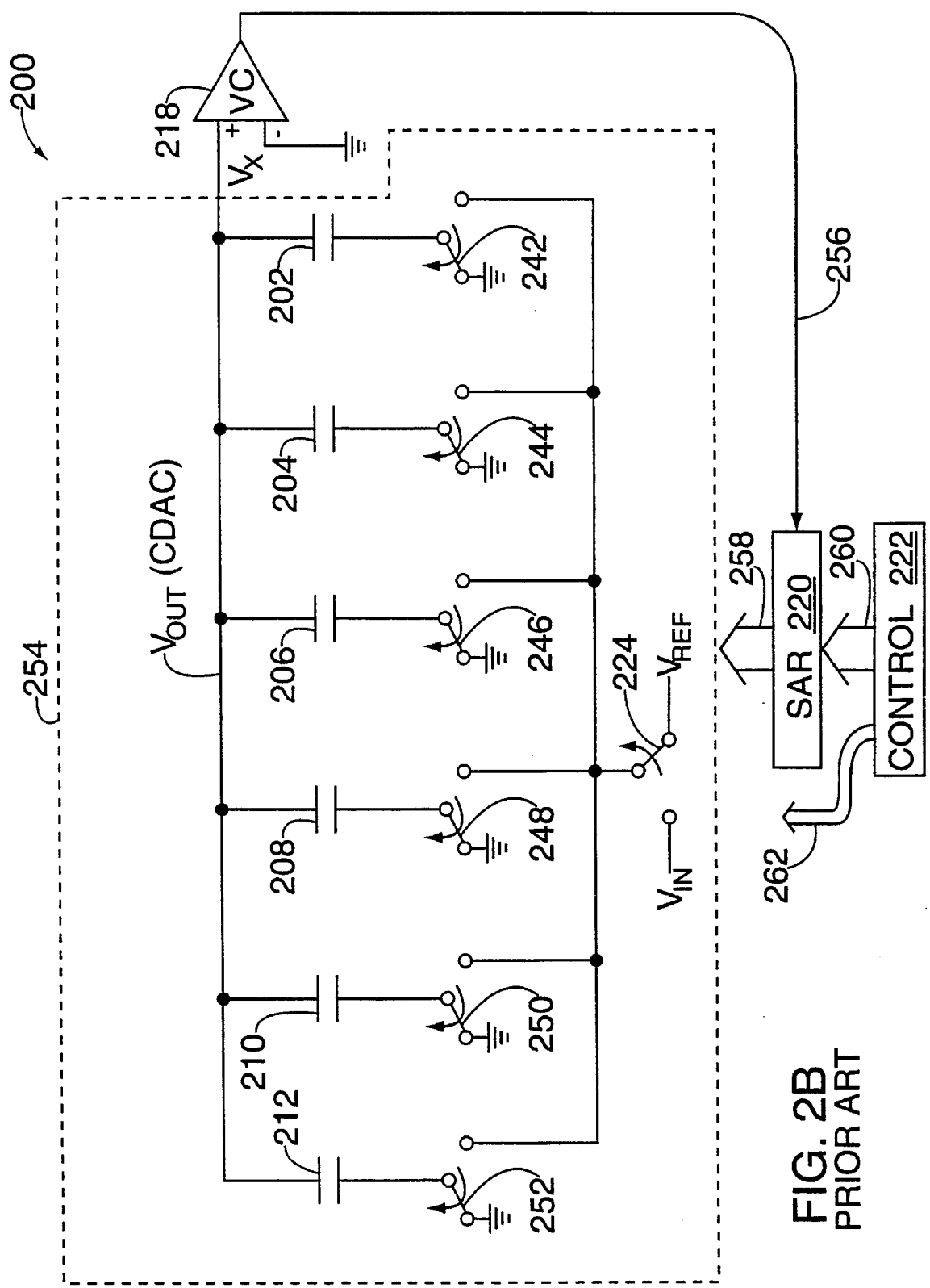
Figure 2C:
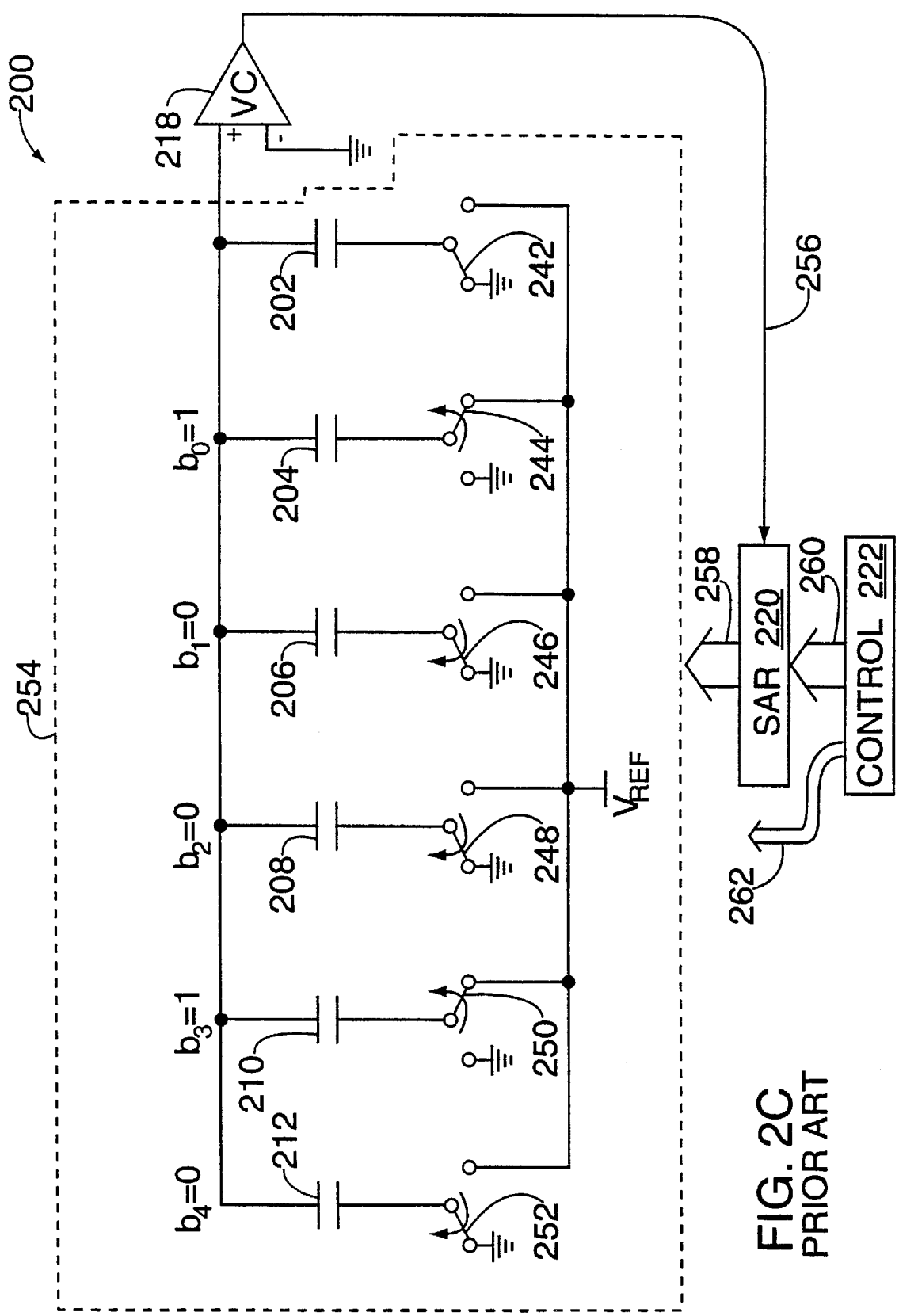

FIGS. 2A, 2B and 2C, collectively referred to as FIG. 2, show an example of a known single analog input successive approximation ADC 200 which is constructed using a single-ended architecture. ADC 200 is constructed in accordance with the principles described in "All-MOS Charge Redistribution Analog-to-Digital Conversion Techniques-Part 1," J. McCreary and P. Gray, IEEE Journal of Solid-State Circuits, Vol. SC-10, No. 6, pp. 371–79, Dec. 1975, which is hereby incorporated by reference in its entirety.

ADC 200 produces a 5-bit digital output with the bits, in increasing order from LSB to MSB, labeled $b_0$, $b_1$, $b_2$, $b_3$, and $b_4$. ADC 200 comprises a CDAC 254 and a voltage comparator 218 (VCOMP 218). VCOMP 218 produces a digital output which is a logic 1 when the voltage at the positive input is greater than the voltage at the negative input, and outputs a logic 0 when the voltage of the negative input is greater than the voltage at the positive input. The positive input of VCOMP 218 is coupled to Vout (of CDAC 254) and the negative input is coupled to ground. ADC 200 also comprises successive approximation register (SAR) 220 and control circuit 222. CDAC 254 uses two voltage references which correspond to the general CDAC equations presented above as follows: Vref1=ground, Vref2=Vref and Vrs=ground.

SAR 220 produces the digital conversion of the sampled analog value as is described below. Control circuit 222 produces a sequence of control signals which performs the successive approximation algorithm. These control signals control at least SAR 220 and sampling switches 224, 242 and 226. SAR 220 produces a 5 bit output which controls switches 244–252. The 5 bit output of SAR 220 comprises bits $b_4$ (the MSB which controls 252) down to bit $b_0$ (the LSB which controls 244).

The generalized CDAC equations given above can be simplified into equations for the specific embodiment of FIG. 2A by setting the bit group values as follows:

q=5; t=0; s=0; r=5; p=0

G(1)=0; G(2)=1; G(3)=2; G(4)=3; G(5)=4

The capacitances Ct, Cs, Csw(y) and Cd(w) for CDAC 254 may be determined as follows:

$$Ct = Cbg_0 + Cbg_1 + Cbg_2 + Cbg_3 + Cbg_4 + Csg \quad (11)$$

$$Cs = Cbg_0 + Cbg_1 + Cbg_2 + Cbg_3 + Cbg_4 + Csg \quad (12)$$

$$Csw(y) = 0 \quad (13)$$

$$Cd(w) = b_0*Cbg_0 + b_1*Cbg_1 + b_2*Cbg_2 + b_3*Cbg_3 + b_4*Cbg_4 \quad (14)$$

Capacitances $Cbg_0$, $Cbg_1$, ... $Cbg_4$ are scaled in proportion to the value of the bit which controls its BP and are, respectively, of relative capacitances: C, 2C, ... 16C. The capacitance of Csg is always set equal to that of $Cbg_0$.

The combination of switch 224 with each of switches 244 to 252 is equivalent to the combination of switches 142 with 138 in FIG. 1. Likewise, the combination of switch 224 with 242 is equivalent to switch 130 of FIG. 1.

Since Csw(y) is zero, the equation for Vthold can be simplified to:

$$Vthold = Vrs + Vs + Vd(w) \quad (15)$$

FIG. 2A illustrates ADC 200 in sampling mode whereby Vout(CDAC) is clamped to ground by switch 226 and the BPs of all capacitor array 202–212 follow Vin. In FIG. 2B, the ADC is in hold mode because Vout(CDAC) is no longer clamped to ground and the input signal has been switched off. FIG. 2B shows the initial bit pattern applied during hold mode which corresponds to w being equal to zero (all of the BPs of capacitor array 202–212 are grounded). The Vs component for FIG. 2B may be determined by applying Equation (5) as follows (where Vref1 is ground):

$$Vs = (0 - Vin)*(Cs/Ct) = -Vin$$

Because Cd(0) is zero, the Vd(0) component is zero and Vrs is also zero. Thus Vthold for FIG. 2B is simply Vs which is –Vin. ADC 200 can only measure voltages where Vin is greater than zero since ADC 200 can only perform a successive approximation when Vthold is a negative voltage.

Successive approximation begins by setting $b_4$ of SAR 220 to 1 which causes the BP of capacitor 212 to switch from gnd to Vref. As can be seen from equations (9) and (14), Vd(16) is a positive voltage change (i.e., term $b_4*Cbg_4$ is positive and the remaining terms are 0). If Vd(16) is larger than Vs, Vthold becomes positive. Vthold becoming positive is detected by the output of VCOMP 218 changing from 0 to 1. If Vd(16) is greater than Vs, in order to continue with the successive approximation of Vs, bit $b_4$ of SAR 220 is set back to 0. Otherwise Vd(16) is less than Vs, and bit $b_4$ of SAR 220 is be left at 1 in order to continue with the successive approximation of Vs.

Successive approximation continues by setting $b_3$ of SAR 220 to 1 which causes the BP of capacitor 210 to switch from gnd to Vref. Depending upon the value of $b_4$, the voltage change is now Vd(24) or Vd(8). The decision process for $b_3$ is the same as for bit $b_4$: if the additional positive voltage change due to Cd(8) causes the total Vd(w) voltage to be greater than Vs, then in order to continue the successive approximation of Vs, bit $b_3$ of SAR 220 must be set back to 0. Otherwise, $b_3$ is left at 1. Successive approximation continues by the same decision process, in order of descending bit value, for bits $b_2$ to $b_0$ of SAR 220.

FIG. 2C shows an example of one final setting of switches 252 to 244 which, in this instance, corresponds to the binary number 01001 (i.e., the grounded capacitors correspond to zero and the capacitors coupled to Vref correspond to one).

Alternatively, the negative input of VCOMP 218 may be connected to Vout(CDAC) and the positive input may be connected to ground. In that case, successive approximation of Vin would then proceed as follows.

As discussed above, when Vin is >0 volts, then Vs<0 volts, and Vthold is initially negative. Since the positive input of VCOMP 218 is at ground, the positive input's voltage is greater than the negative input's voltage and therefore the output of VCOMP 218 output is 1.

Successive approximation begins by setting $b_4$ of SAR 220 to 1 which causes the BP of capacitor 212 to switch from gnd to Vref. The decision process as to whether to leave this bit set is the same as was described above except that the output of VCOMP 218 is inverted. If Vd(16) is larger than Vs, Vthold becomes positive. Vthold becoming positive is detected by the output of VCOMP 218 changing from 1 to 0. If Vd(16) is greater than Vs, in order to continue with the successive approximation of Vs, bit $b_4$ of SAR 220 is set back to 0. Otherwise Vd(16) is less than Vs, and bit $b_4$ of SAR 220 is left at 1 in order to continue with the successive approximation of Vs. Successive approximation continues, as was described above, by setting each of $b_3$ to $b_0$ in order of descending bit value.

An advantage of a CDAC based ADC architecture, such as shown in FIG. 2, is its efficiency since the CDAC provides an inherent sample and hold. ADC 200 samples the input signal when switch 224 is connected to Vin, switches 244–252 are connected to switch 224 and when switch 226 is closed. The signal is held at the moment when switch 226 is opened since thereafter voltage at Vout(CDAC) is determined solely by Vrs plus any changes in the voltage divider formed by the various settings of switch 224 and switches 242 to 252.

Unfortunately, at least two potentially significant problems exist with CDAC 254. First, an error charge may be injected into the circuit at Vout(CDAC) when switch 226 opens. Typically, switch 226 is implemented with an MOS transistor. While this transistor is conducting, its channel contains a certain amount of charge. Some of this channel charge may be injected into the capacitors coupled to Vout(CDAC) when switch 226 opens. This error charge produces an offset error in voltage measured.

Second, a prohibitively large ratio between capacitors from MSB to LSB is required for a high resolution CDAC. For example, a 12 bit CDAC would require a MSB to LSB capacitor ratio of 2048. Large ratios are difficult to manufacture and can consume large amounts of die area.

Figure 3A:
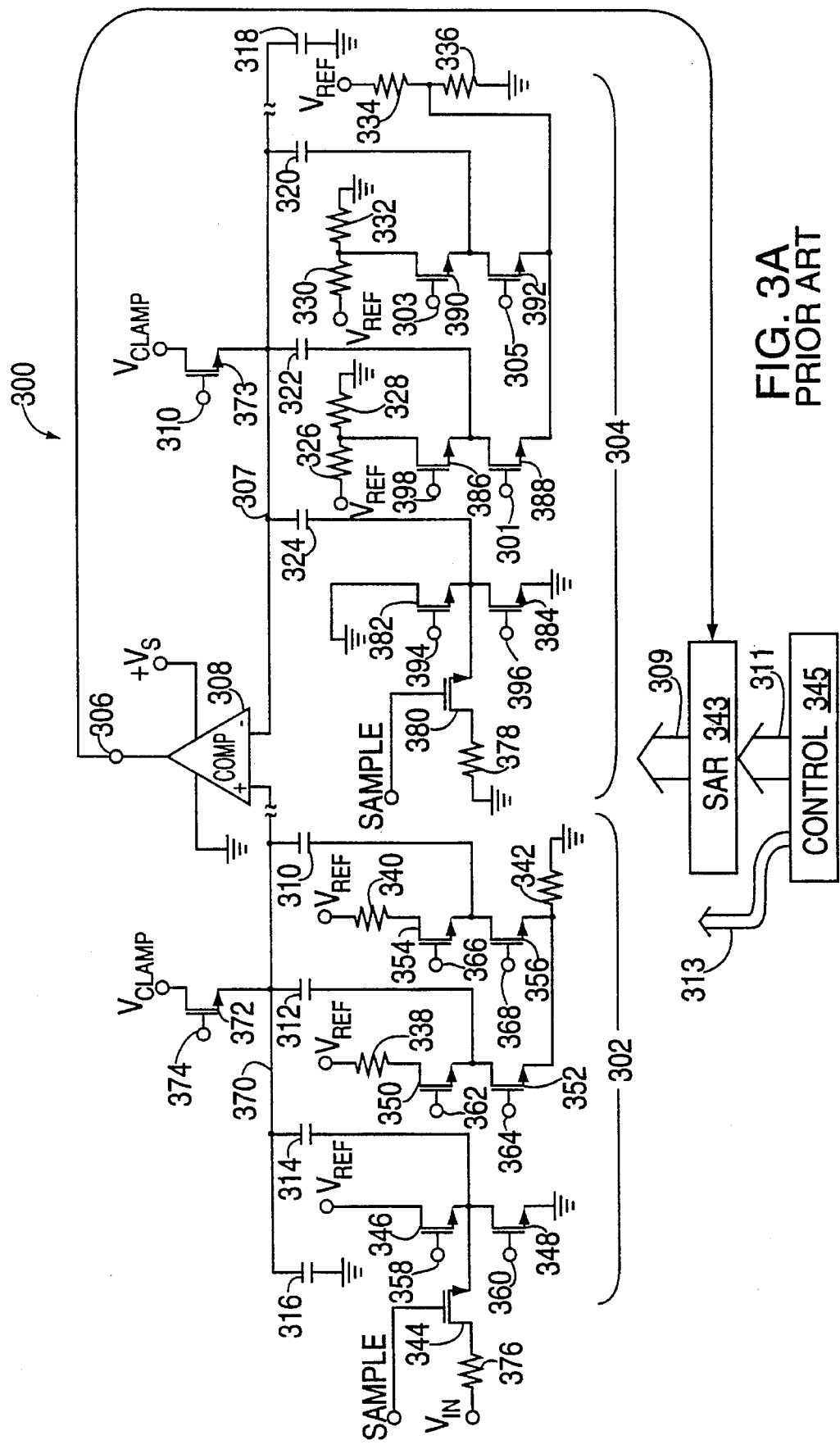
FIGS. 3A–3B are schematic diagrams of known CDAC-based single input ADCs with a single-ended architecture including, respectively, a dummy array and a scaling capacitor.
Figure 3B:
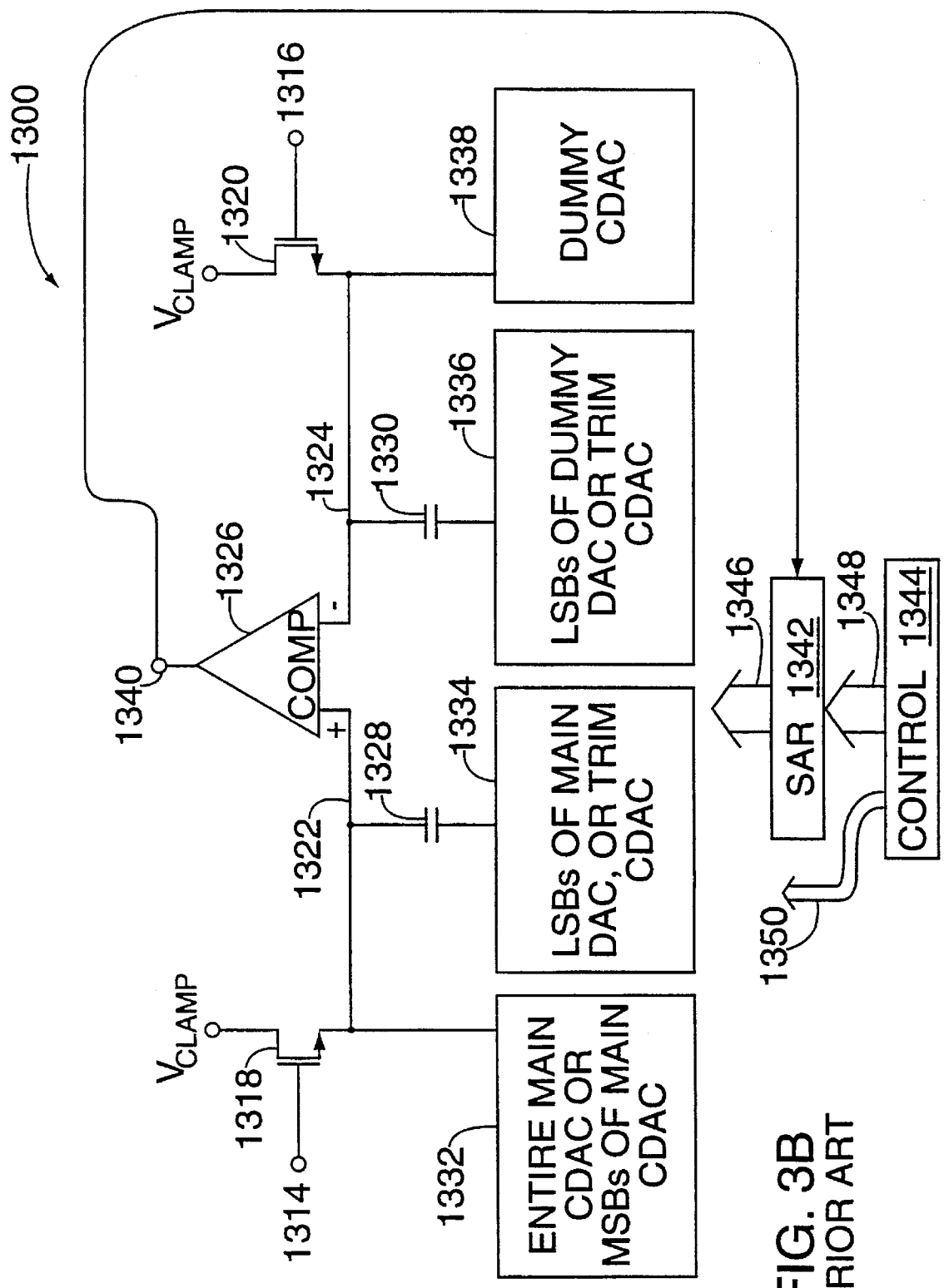

FIGS. 3A and 3B show ADCs 300 and 1300, respectively, which address both of these problems. The ADCs of FIGS. 3A and 3B are described in Smith et al. U.S. Pat. No. 4,947,169, which is incorporated herein by reference. As shown in FIG. 3A, ADC 300 comprises CDAC 302, trimmable dummy CDAC 304, VCOMP 308, SAR 343 and control circuit 345.

When dummy CDAC 304 is considered to be only a means for providing a constant Vref voltage to the negative input of VCOMP 308, then the operation of ADC 300 can be explained as follows.

CDAC 302 comprises binarily weighted capacitors, from MSB to LSB respectively, 314, 312 and 310. Transistors 344, 346 and 348 are equivalent to switches 142 and 138 of FIG. 1. Transistor pairs 350, 352 and 354, 356 are each equivalent to switch 134 of FIG. 1. Capacitor 316 is equivalent to capacitor 112 of FIG. 1. CDAC 302 uses two voltage references which correspond to the general CDAC equations presented above as follows: Vref1=ground, Vref2=Vref and Vrs=$V_{CLAMP}$ and Vref=$V_{CLAMP}$.

The capacitances Ct, Cs, Csw(y) and Cd(w) for CDAC 302 may be determined as follows:

$$Ct = Cwg_0 + Cwg_1 + Cbg_2 + Cg \quad (16)$$

$$Cs = Cbg_2 \quad (17)$$

$$Csw(y) = b_0 * Cwg_0 + b_1 * Cwg_1 \quad (18)$$

$$Cd(w) = b_0 * Cwg_0 + b_1 * Cwg_1 + b_2 * Cbg_2 \quad (19)$$

Capacitances $Cwg_0$, $Cwg_1$, $Cbg_2$ are scaled in proportion to the value of the bit which controls its BP and are, respectively, of relative capacitances: C, 2C, 4C. The capacitance of Cg is always set equal to that of $Cwg_0$. The equations for Vs, Vsw(y) and Vd(w) (from general equations (5), (7) and (9) given above) are:

$$Vs = -Vin * (\frac{1}{2}) \quad (20)$$

$$Vsw(y) = -Vref * (Csw(y)/8C) \quad (21)$$

$$Vd(w) = Vref * (Cd(w)/8C) \quad (22)$$

Successive approximation for ADC 300 proceeds in essentially the same manner as was described above for ADC 200. Two differences between ADC 300 and ADC 200 which affect the successive approximation process are that CDAC 302 can have a non-zero Vsw(y) component and that CDAC 302 has a non-zero value for Vrs.

ADC 300 has a non-zero, and negative, Vsw(y) component when y is greater than zero. However, the value to which y is set during sampling does not alter the procedure by which the output of VCOMP is tested to determine each bit of the approximation. A negative Vsw(y) component allows ADC 300 to measure negative voltages at Vin (as well as positive voltages) while with a zero Vsw(y) component only positive Vin voltages can be measured.

Rather than detecting whether the positive input of VCOMP 308 has become greater than zero, the use of Vref as the value for Vrs means that VCOMP 308 detects when its positive input is greater than Vref (since as noted above Vref is equal to $V_{CLAMP}$). The meaning of VCOMP 308 becoming either a 1 or a 0 is the same, for the successive approximation testing procedure, as was described above for ADC 200.

The dummy CDAC 304 reduces the offset error which may be injected into CDAC array 302 as follows. Both arrays 302 and 304 have sampling switches, respectively 372 and 373, that open when the signal is held. If the ratio of Ct to the channel size of switch 372 for CDAC 302 is the same as the ratio of Ct to the channel size of switch 373 for dummy CDAC 304, then the charge injection offset is reduced by the common mode rejection of VCOMP 308. One drawback to this approach is that dummy CDAC 304 consumes the same amount of die area as CDAC array 302 because array 304 must have the same layout in order to be well matched.

In addition to acting as a dummy CDAC for the purposes of charge injection offset reduction, dummy CDAC 304 has additional capabilities which are not relevant to the present invention. For the purposes of the present invention, it is sufficient to describe dummy CDAC 304 as follows: its ratio of Ct to switch 373 channel size is the same as the corresponding ratio in CDAC 302, and the BPs of all capacitors connected to Vout node 307 are coupled to ground or substantially to ground.

The additional capabilities of dummy CDAC 304 are as follows. Capacitors 320 and 322 have resistor trimming networks, respectively, of 330, 332 and 326, 328. Resistor networks 330, 332 and 326, 328 are used to adjust the effective capacitance of, respectively, capacitors 312 and 314. Resistors 334, 336 are the reference against which resistor networks 330, 332 and 326, 328 are trimmed. Resistors 340 and 338 are chosen to match the impedance of, respectively, trim networks 330, 332 and 326, 328. Resistor 342 is chosen to match the impedance of trim reference network 334, 336.

As was the case with VCOMP 218 in the circuit of FIG. 2, VCOMP 308 may also have its inputs reversed. For example, VCOMP 308 may alternatively have its positive input coupled to dummy CDAC 304 and its negative input coupled to CDAC 302. As was the case for VCOMP 218 of FIG. 2, this alternate embodiment for VCOMP 304 follows the same decision process except that the output of VCOMP 304 is inverted.

FIG. 3B shows ADC 1300, which avoids a large ratio between the MSB and LSB capacitors of the main CDAC (corresponding to CDAC 302) through the use of scaling capacitor 1328. The capacitors coupled to Vout(CDAC) 1322 through scaling capacitor 1328 are referred to as the LSB array, while the capacitors directly coupled to Vout(CDAC) 1322 form the MSB array. As discussed above, the value of scaling capacitor 1328 determines the weight of the bits which control the LSB capacitor array. Scaling capacitor 1328 is typically set to be approximately equal to the least significant capacitor in the MSB capacitor array. A scaling capacitor equal to the MSB array's least significant capacitor allows each bit of the LSB array to be implemented with the same sized capacitor of the corresponding bit in the MSB array.

The value of scaling capacitor 1328 may be significantly affected by the parasitic capacitance of the layout, which would include the capacitance of the wires connecting the scaling capacitor between the LSB array 1334 and Vout(CDAC) 1322. Sensitivity to layout capacitance makes it difficult to predictably manufacture precise ratioing between the MSB and LSB arrays. An error in the ratioing may result in a differential linearity error for the CDAC at the transition between the MSB and LSB arrays.

The use of a scaling capacitor as shown in FIG. 3B may be combined with the use of a dummy CDAC as shown in FIG. 3A.

ADCs with differential inputs which are implemented with a differential architecture are also known and are typically used to measure the difference between two voltage signals. The following is a general discussion of known differential ADC design principles.

Rather than having a ground or a dummy array connected to the other input of the comparator, a differential ADC couples a second CDAC to the other input.

Due to the extra complexity of differential ADCs, it will be helpful to introduce some terminology. The CDAC coupled to the positive input is referred to as the positive CDAC and the CDAC coupled to the negative input is the negative CDAC. Accordingly, Vin for the positive CDAC is the positive analog input and Vin for the negative CDAC is the negative analog input (persons skilled in the art will understand that positive and negative analog inputs are merely references and that the circuits described herein are fully functional for instances where both inputs are the same polarity).

A differential ADC uses two varieties of CDACs called an increasing CDAC and a decreasing CDAC. An increasing CDAC's Vthold increases with a numerically increasing bit pattern w on its input bits while a decreasing CDAC's Vthold decreases with a numerically increasing bit pattern w on its input bits. The bit pattern w is interpreted, numerically, as an unsigned binary integer.

The positive and negative CDACs are controlled by a control circuit such that they both work in parallel. During sample mode, the positive CDAC samples the positive analog input and the negative CDAC samples the negative analog input. During hold mode, as each SAR bit i, from MSB to LSB, is tested at a value of "1," the ith capacitor of the positive CDAC has its BP switched between Vref1 and Vref2 while the ith capacitor of the negative CDAC has its BP switched between Vref1 and Vref2.

Differential ADCs may be classified into two types depending on which variety of CDAC is connected to the inputs of the comparator. The first type, called an inverted differential ADC, has an increasing CDAC connected to the positive input and a decreasing CDAC connected to the negative input. It is called an inverted differential ADC because each SAR bit i is set to a value which is the opposite of the comparator's output. The second type, called a non-inverted differential ADC, has an increasing CDAC connected to the negative input and a decreasing CDAC connected to the positive input. In a non-inverted differential ADC each SAR bit i is set to the same value as the output of the comparator.

Specifically, the decision process, as to whether the ith SAR bit stays at 1 or is switched back to 0, is the same as described above for the single-input ADC. For an inverted differential ADC the process is as follows. If VCOMP's output becomes logic 1, then the additional voltage chance caused by the ith bit, when added to the voltage change due to the previously tested bits, is greater than the difference being measured and the ith bit must be set back to 0 for successive approximation to continue. Otherwise the ith bit is left set to 1. Successive approximation begins by testing the MSB and ends with testing the LSB. For a non-inverted differential ADC the decision process for each bit of the successive approximation remains the same with the exception of VCOMP's output being inverted.

A differential ADC may operate in a unipolar or bipolar fashion. For a unipolar inverted differential ADC, the ADC can only measure differences when the positive analog input has a greater voltage than the negative analog input. For a unipolar non-inverted differential ADC, the ADC can only measure differences when the negative analog input has a greater voltage than the positive analog input. Bipolar operation, with either an inverted or non-inverted differential ADC, can measure differences between the two analog inputs regardless of whether the positive analog input's voltage is greater than, or less than, the voltage of the negative analog input.

Unipolar operation of a differential ADC is achieved by having both the positive and negative CDACs output the same Vthold when the following two conditions are satisfied: the same voltage is applied to the positive and negative analog inputs, and the input word w is set to 0 during hold mode to both CDACs. Typically, unipolar operation is achieved by setting y equal to 0 during sampling, thereby causing Vsw(0) to be a component of the Vthold equations. Depending on the CDAC design, Vsw(0) is either a substantially zero voltage or a nonzero voltage. In the case where Vsw(0) is substantially zero, Vd(0) is also substantially zero. Alternatively, in the case where Vsw(0) is a non-zero voltage, Vd(0) is an equal and opposite voltage. In either case, Vthold for both CDACs is determined by Vs and Vrs and therefore, the Vtholds of the two CDACs is the same when the above two conditions are satisfied.

Increasing w above zero causes the Vtholds of the positive and negative CDACs to move in opposite directions. Specifically, the Vd(w) component of the increasing CDAC increases while the Vd(w) component of the decreasing CDAC decreases. The maximum range (or max_range) by which the input bits q can vary Vthold, for a particular CDAC, is:

$$\text{max\_range} = Vd(\text{maxval}) - Vd(0) \text{ where maxval} = 2^q - 1 \qquad (23)$$

For an increasing CDAC, max_range is a positive number, while for a decreasing CDAC it is negative.

The goal in bipolar operation is to shift backwards, with respect to unipolar operation, the Vtholds of the two CDACs by $(-\frac{1}{2})*\text{max\_range}$. The Vthold equation for the increasing CDAC has a component subtracted (of magnitude $\frac{1}{2}*\text{max\_range}$) while the decreasing CDAC has a component added (of magnitude $\frac{1}{2}*\text{max\_range}$).

This shifting of the Vtholds of the positive and negative CDACs allows one to interpret the output of the SAR for a bipolar inverting differential ADC as follows. SAR is equal to half of maxval when the positive and negative analog inputs are equal. SAR is greater than half of maxval when the positive analog input is greater than the negative analog input. SAR is less than half of maxval when the negative analog input is greater than the positive analog input.

For a bipolar non-inverting differential ADC, the SAR output is interpreted as follows. SAR is equal to half of maxval when the positive and negative analog inputs are equal. SAR is greater than half of maxval when the negative analog input is greater than the positive analog input. SAR is less than half of maxval when the positive analog input is greater than the negative analog input.

Figure 4A:
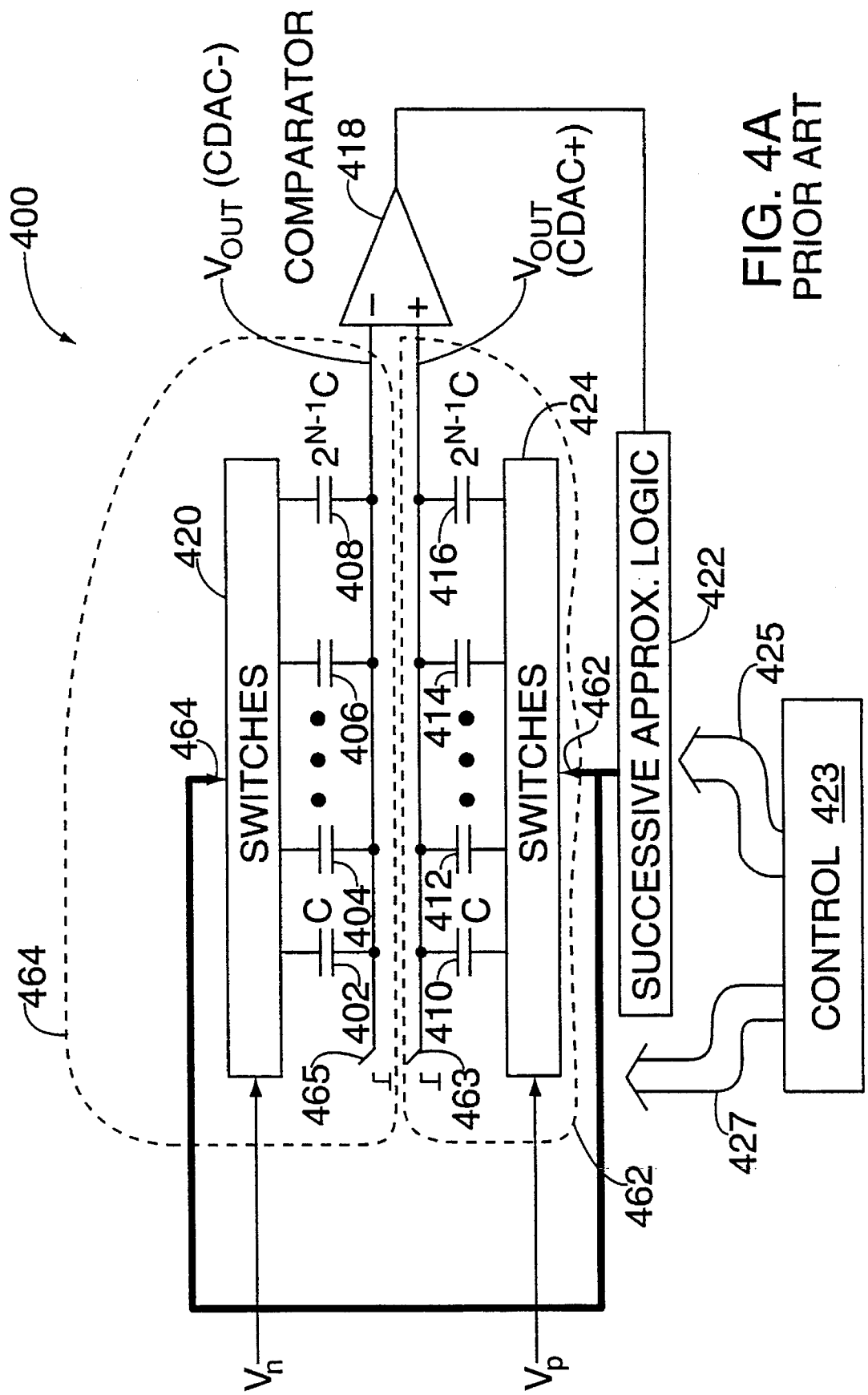
FIGS. 4A–4C are schematic diagrams of known differential input ADCs implemented with a differential architecture.

FIG. 4A shows N-bit ADC 400 with differential inputs and implemented with a differential architecture. A similar differential ADC is described in "Error Correction Techniques for High-Performance Differential A/D Converters," Khen-Sang Tan et al., IEEE Journal of Solid-State Circuits, Vol. 25, No. 6, pp. 1318–27, Dec. 1990, which is incorporated herein by reference. ADC 400 may be either inverting or non-inverting and comprises positive CDAC 462 (which comprises capacitor array 410–416 and switch configurations 424), negative CDAC 464 (which comprises capacitor array 402–408 and switch configurations 420), VCOMP 418, SAR 422 and control circuit 423. VCOMP 418, SAR 422 and control circuit 423 operate in a substantially similar manner to like components of FIGS. 2 and 3A.

Capacitors 402–408, each configured as a $Cbg_i$ capacitor with configuration switches 420, have binarily increasing values from C for the LSB (i.e., capacitor 402) to $2^{N-1}C$ for the MSB (i.e., capacitor 408). Thus during sampling, all the capacitors of CDAC 464 are connected to analog input Vn. Likewise, capacitors 410–416, each configured as a $Cbg_i$ capacitor with configuration switches 424, have binarily increasing values from C for the LSB (i.e., capacitor 410) to $2^{N-1}C$ for the MSB (i.e., capacitor 416). As with CDAC 464, during sampling all the capacitors of CDAC 462 are connected to analog input Vp. Sampling of CDAC 464 is controlled, in part, by switch 465, which is coupled between Vout(CDAC−) and ground. Likewise, sampling of CDAC 462 is controlled, in part, by switch 463, which is coupled between Vout(CDAC+) and ground.

Negative CDAC 464 uses capacitors of the same capacitance and configuration as used in the corresponding bit positions of the positive CDAC 462. Essentially, negative CDAC 464 only differs from positive CDAC 462 in the voltage reference used for Vref2. For both CDACs, Vref1 is set to ground. However, for one of the CDACs Vref2 is a positive voltage while for the other CDAC Vref2 is of equal magnitude but is a negative voltage.

Both the positive CDAC 462 and the negative CDAC 464 have the same set of equations. These equations are the same as for FIG. 2 except that they must be generalized for N-bits.

Figure 4B:
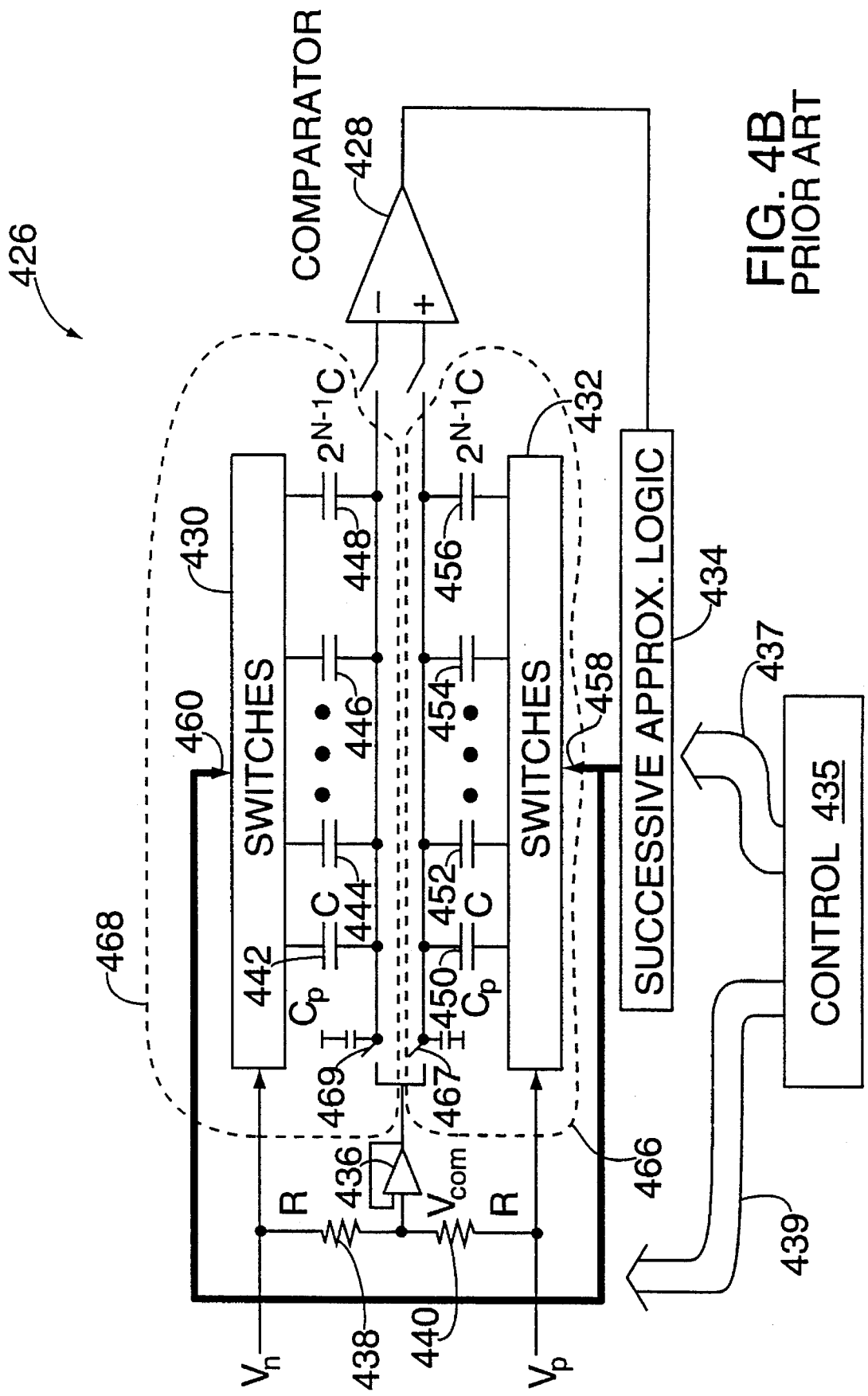
Figure 4C:
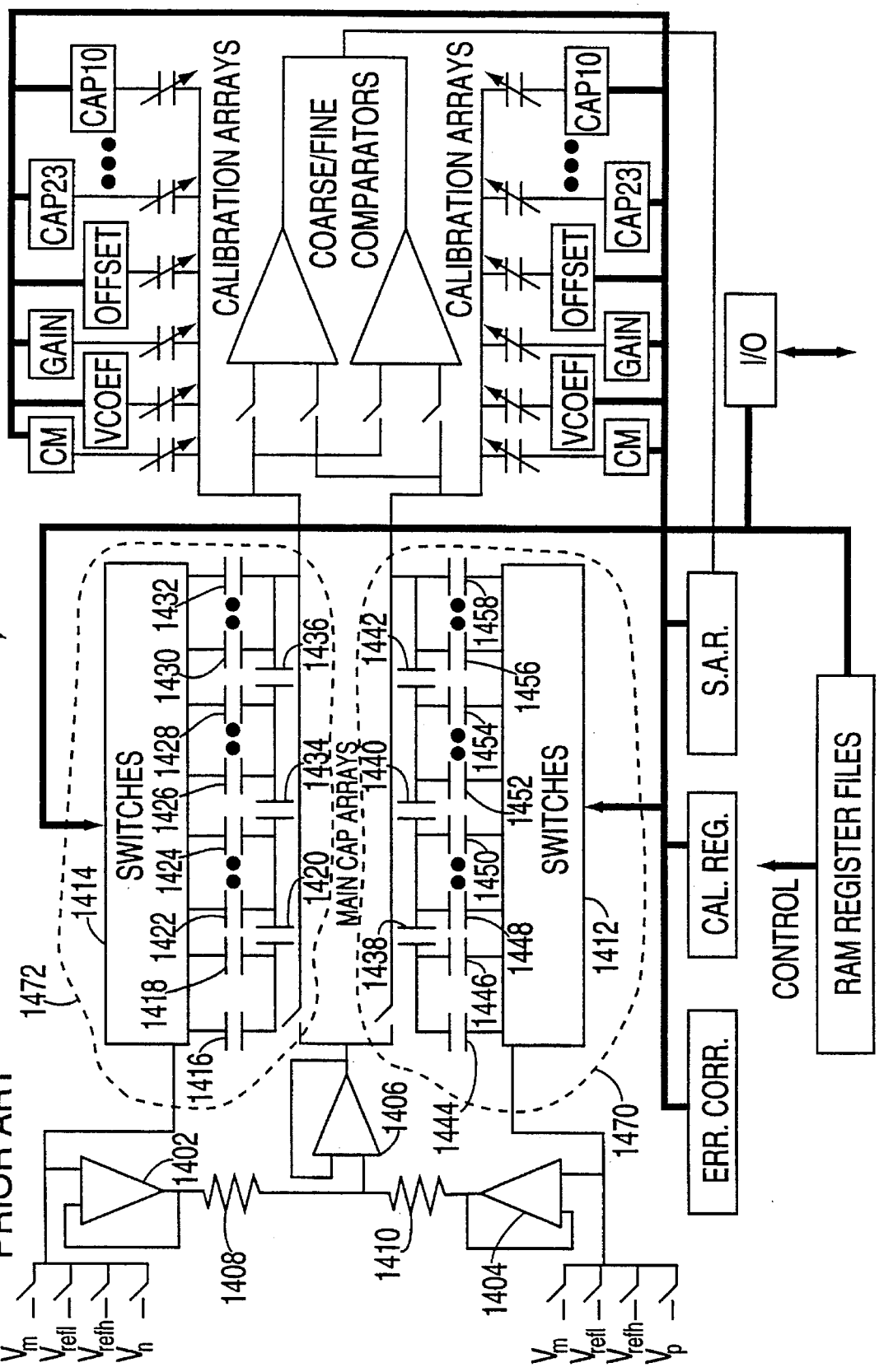

While particular varieties of ADC with differential inputs and a differential architecture is shown in FIGS. 4A–4C, persons skilled in the art will appreciate that alternative variations may be used.

Compared to single input ADC 200, differential ADC 400 has at least the following advantages: it inherently provides charge injection offset reduction and it has differential inputs. Some drawbacks with the ADC architecture of FIG. 4A include: the requirement of a large amount of die area because two complete CDACs must be implemented, the need for scaling capacitors when resolution increases cause unacceptable capacitor sizes, and the fact that the full CMV will appear at the Vouts of CDACs 464 and 462. Often, the CMV must be canceled in order for it to stay within the limited CMR of the VCOMP over the full range of voltages which may be applied to the differential inputs of the ADC.

FIG. 4B shows an ADC 426 which utilizes a known circuit for canceling the CMV to substantially zero. Resistors 438 and 440 produce the CMV of Vn and Vp which is buffered and becomes Vrs for both CDACs 466 and 468. Thus the CDACs only sample the differential voltage and the Vouts of the CDACs always approach ground as the successive approximation progresses.

FIG. 4C shows a known use of scaling capacitors with a differential input differential architecture ADC. CDACs 1470 and 1472 are each very similar to one of CDACs 466 and 468 of ADC 426. However, CDAC 1470 has scaling capacitors 1438, 1440 and 1442 which break up the capacitor array 1444 to 1458 into four sub-arrays. Likewise, CDAC 1472 has scaling capacitors 1420, 1434 and 1436 which break up the capacitor array 1416 to 1432 into four sub-arrays.

DETAILED DESCRIPTION OF THE INVENTION

The present invention comprises an improved analog-to-digital converter circuit in which a comparator coupled CDAC provides high data resolution while maintaining a relatively low capacitor size ratio between the LSB capacitor and the MSB capacitor. In a preferred embodiment of the present invention the CDAC is split into two substantially equal sections, an MSB section and an LSB section, which are applied to separate inputs of a comparator. The two sections are supplied by a single reference voltage source which provides appropriately scaled reference signals to the CDAC sections such that the second CDAC section adds resolution to the first CDAC section. The CDAC and comparator are operated by a control unit such that the comparator and the SAR approximates the difference between the first and second analog inputs as a digital value.

Figure 5:
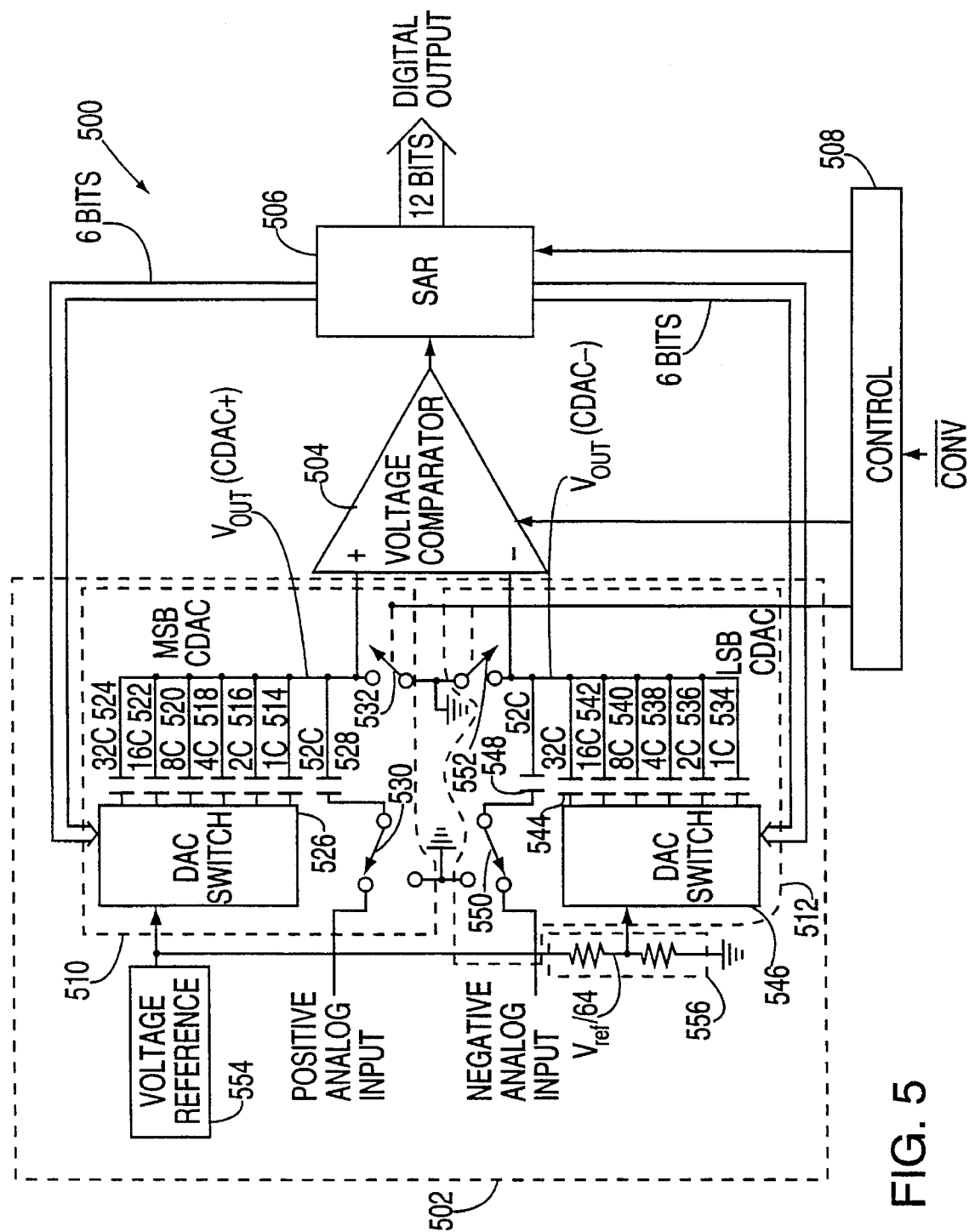
FIG. 5 is a schematic diagram of a differential input ADC implemented with a comparator coupled CDAC architecture in accordance with the principles of the present invention.

FIG. 5 illustrates an implementation of 12-bit inverting differential input comparator coupled architecture ADC 500, which incorporates the principles of the present invention. ADC 500 comprises CDAC 502, VCOMP 504, SAR 506 and control unit 508. The outputs of CDAC 502 are coupled to the inputs of VCOMP 504, while the output of VCOMP 504 is coupled as the input to SAR 506. SAR 506 provides the digital output of ADC 500, as well as providing control signals to CDAC 502. CDAC 502, VCOMP 504 and SAR 506 are all coupled to, and controlled by, control unit 508 based upon a selected conversion method for a given circumstance. For example, in the preferred embodiment of the present invention, the successive approximation conversion is used.

CDAC 502 is split into two sections which may be referred to as MSB (IDAC 510 and LSB CDAC 512 (it is preferable that the two sections be substantially identical). MSB CDAC 510 is referred to as a positive CDAC and LSB CDAC 512 is referred to as a negative CDAC. MSB CDAC 510 comprises capacitors 514–524, which have their BPs coupled to DAC switch 526, dedicated sampling capacitor 528, which is coupled to the positive analog input signal through switch 530, and sampling switch 532. LSB CDAC 512 similarly comprises capacitors 534–544, which have their BPs coupled to DAC switch 546, dedicated sampling capacitor 548, which is coupled to the negative analog input signal through switch 550, and sampling switch 552. MSB CDAC 510 is controlled by bits $b_{11}, b_{10}, \ldots b_6$ of the output of SAR 506, while LSB CDAC 512 is controlled by bits $b_5, b_4, \ldots b_0$.

CDAC 502 also includes voltage reference 554 and reference scaling network 556, which provide reference signals, respectively, to DAC switches 526 and 546. The reference voltage Vref2 for LSB CDAC 512 is 1/64th of the reference voltage Vref2 for MSB CDAC 510. For both the positive and negative CDACs, Vref2 is a positive Vref and Vref1 is ground.

The 6 input bits of positive CDAC 510 control capacitors 514–524, which are of configuration $Cwg_i$. The 6 input bits of negative CDAC 512 control capacitors 534–544, which are of configuration $Cwv_i$. Charge injection offset reduction is achieved by ADC 500 because the positive and negative CDACs are essentially identical (as described above, this balances the charge): they have the same number of input bits, each capacitor of MSB CDAC 510 has the same capacitance as the corresponding capacitor of LSB CDAC 512 (i.e., capacitor 514 is equal to capacitor 534, etc.), and the sampling switches of both CDACs have the same channel size.

In general, charge injection offset reduction is achieved by ensuring that the ratio of Ct to sampling switch 532's channel size for MSB CDAC 510 is the same as the ratio of Ct to sampling switch 552's channel size for LSB CDAC 512.

The generalized CDAC equations given above can be simplified into equations for increasing MSB CDAC 510 by setting the bit group values as follows:

q=6; t=6; s=0; r=0; p=0

A(1)=6, A(2)=7, A(3)=8, A(4)=9, A(5)=10, A(6)=11

The key capacitances, Ct, Cs, Csw(y) and Cd(w), have the following equations (where Vref1 =Vrs =ground and Vref2= voltage reference 554):

$$Ct = Csg + Cwg_6 + Cwg_7 + Cwg_8 + Cwg_9 + Cwg_{10} + Cwg_{11} \quad (25)$$

$$Cs = Csg \quad (26)$$

$$Csw(y) = b_6 * Cwg_6 + b_7 * Cwg_7 + b_8 * Cwg_8 + b_9 * Cwg_9 + b_{10} * Cwg_{10} + b_{11} * Cwg_{11} \quad (27)$$

$$Cd(w) = b_6 * Cwg_6 + b_7 * Cwg_7 + b_8 * Cwg_8 + b_9 * Cwg_9 + b_{10} * Cwg_{10} + b_{11} * Cwg_{11} \quad (28)$$

The generalized CDAC equations given above can be simplified into equations for decreasing LSB CDAC 512 by setting the bit group values as follows:

$q=6; t=0; s=6; r=0; p=0$ $B(1)=0, B(2)=1, B(3)=2, B(4)=3, B(5)=4, B(6)=5$

The key capacitances, Ct, Cs, Csw(y) and Cd(w) have the following equations (where Vref1=Vrs=ground and Vref2= Vref/64):

$$Ct = Csg + Cwv_0 + Cwv_1 + Cwv_2 + Cwv_3 + Cwv_4 + Cwv_5 \quad (29)$$

$$Cs = Csg \quad (30)$$

$$Csw(y) = NOT(b_0)*Cwv_0 + NOT(b_1)*Cwv_1 + NOT(b_2)*Cwv_2 + NOT(b_3)*Cwv_3 + NOT(b_4)*Cwv_4 + NOT(b_5)*Cwv_5 \quad (31)$$

$$Cd(w) = NOT(b_0)*Cwv_0 + NOT(b_1)*Cwv_1 + NOT(b_2)*Cwv_2 + NOT(b_3)*Cwv_3 + NOT(b_4)*Cwv_4 + NOT(b_5)*Cwv_5 \quad (32)$$

The circuits of the present invention provide a Vref2 to one of the CDACs (e.g, LSB CDAC 512) that is scaled to a lesser magnitude with respect to the Vref2 of the other CDAC (e.g., MSB CDAC 510). Scaling LSB CDAC 512's voltage reference enables its input bits to add additional resolution to the ADC, rather than simply duplicating the resolution of MSB CDAC 510. Contrary to previously described techniques, however, the extra resolution is achieved without the use of a scaling capacitor.

The voltage reference Vref2 for LSB CDAC 512 (Vref1sb) may be scaled down with respect to the Vref2 of MSB CDAC 510 as follows. A change in Vthold at the positive input of VCOMP 504 due to a change in the MSB of MSB CDAC 510 is:

$(Cmsbofmsb/Ctofmsb)*Vrefmsb$

Where Cmsbofmsb is the MSB capacitor of the MSB CDAC 510 (i.e., capacitor 524), Ctofmsb is the total capacitance at Vout(CDAC+), and Vrefmsb is the Vref2 of MSB CDAC 510. A change in the Vthold at the negative input of VCOMP 504 due to a change in the MSB of LSB CDAC 512 is:

$(Cmsboflsb/Ctoflsb)*Vref1sb$

Where Cmsboflsb is the MSB capacitor of LSB CDAC 510 (i.e., capacitor 544), Ctoflsb is the total capacitance at Vout(CDAC−), and Vref1sb is the Vref2 of LSB CDAC 512. If MSB CDAC 510 has m bits then Vref1sb should be scaled with respect to Vrefmsb such that:

$$((Cmsbofmsb/Ctofmsb)*Vrefmsb)/2^m = (Cmsboflsb/Ctoflsb)*Vref1sb \quad (33)$$

This can be rewritten as:

$$Vref1sb = (Vrefmsb/2^m)*(Cmsbofmsb/Ctofmsb)*(Ctoflsb/Cmsboflsb) \quad (34)$$

While scaling Vref2 of LSB CDAC 512 eliminates one level of scaling capacitor, if even higher resolution is desired, scaling capacitors could be still utilized in conjunction with the principles of the present invention. In such a case, the scaling capacitor is introduced into the circuit of LSB CDAC 512.

Additionally, during hold mode, ADC 500 operates differently than previously described differential ADCs. As described above, typical differential ADCs operate the positive and negative CDACs in parallel. However, because LSB CDAC 512 is adding resolution, MSB CDAC 510 and LSB CDAC 512 are operated sequentially. First MSB CDAC 510 performs the successive approximation algorithm, or other appropriate conversion algorithm, from its MSB to LSB while LSB CDAC 512's w input is held constant at a value of zero. Secondly, LSB CDAC 512 performs the successive approximation algorithm from its MSB to LSB while the approximation obtained for MSB CDAC 510 is held constant. Therefore, the approximation derived for MSB CDAC 510 may be adjusted by the approximation derived for LSB CDAC 512.

For any particular ADC design (i.e., inverting or non-inverting), the invention can be practiced in several different manners. For example, MSB CDAC 510 and LSB CDAC 512 may be, respectively, the increasing CDAC and the decreasing CDAC. Alternatively, MSB CDAC 510 and LSB CDAC 512 may be, respectively, the decreasing CDAC and the increasing CDAC. The decision process, as to whether the ith SAR bit of the successive approximation stays at 1 or is switched back to 0, is unaffected by which CDAC is selected to be the LSB CDAC. Additionally, the interpretation of the SAR's output, in unipolar or bipolar operation, is unaffected by which CDAC is selected to be the LSB CDAC. For ADCs constructed in accordance with the principles of the present invention, both the decision process and the interpretation of the SAR's output are only determined by whether the ADC is of the inverting or non-inverting type.

As with any differential ADC, as previously described, ADCs constructed in accordance with the principles of the present invention may be operated as single-input ADCs by simply connecting one of the analog inputs to gnd.

For the comparator coupled CDAC architecture presented, since it does not utilize CMV canceling circuitry, the CMV may vary. In general the common-mode rejection ratio (CMRR) of the voltage comparator may be expressed by the following formula:

CMRR=(change in the CMV)/(change in the offset voltage)

Where: the CMV is the average of the voltages applied to the comparator's inputs, and the offset voltage is the voltage needed to null the output of the comparator to be halfway between a one and a zero. For the purposes of this definition of offset voltage, the output of the comparator is the output of a non-latching comparator or the node before the input to the latch in a latching comparator.

In order to define an upper bound on the amount of differential linearity error of a comparator coupled CDAC over the CMR, a minimum common-mode rejection ratio (CMRRmin) for the VCOMP is calculated as follows:

$$CMRRmin = 2^M / max\_error \qquad (35)$$

Where: M is the number of bits in the LSB CDAC, and max_error is the maximum allowable linearity error expressed in the number of LSBs of the LSB CDAC.

For the example of FIG. 5, assuming a maximum linearity error of ½ LSB of the LSB CDAC is desired, the value of CMRRmin is:

$$CMRRmin = 2^6/0.5 = 64/0.5 = 128 \text{ or approx 42 dB} \qquad (36)$$

Thus, to achieve a linearity error of less than 0.5 LSB the CMRR of VCOMP must be greater than 42 dB.

Another novel technique of the present invention is the application of capacitive input voltage attenuation (CIVA), to certain categories of ADCs, in two ways: (i) to reduce the CMV to be within the CMR of the comparator or (ii) to permit the implementation of bipolar operation.

With regard to application (i), CIVA is practiced to provide an attenuation of the input signal by insuring that Cs is sufficiently less than Ct to keep the CMV within the CMR of VCOMP. This application of CIVA allows complex CMV canceling circuitry, such as that discussed for FIG. 4B, to be eliminated.

With regard to application (ii), CIVA is practiced such that sufficient SAR bit controlled capacitors are available, which are not being used for sampling, to backwards shift the Vtholds of the two CDACs (with an appropriate value of y during sampling) with the following value for Vsw(y):

$$Vsw(y) = (-½) * max\_range \qquad (37)$$

CIVA may be applied, according to application (i) or (ii), in a novel way to ADCs in at least the following categories: differential input single-ended architecture (DISA), differential input differential architecture (DIDA), single input differential architecture (SIDA), differential input comparator coupled CDAC architecture (DICA) and single input comparator coupled CDAC architecture (SICA).

The novel DISA category of ADC is constructed by adding a sampling-only capacitor (of type Csg or Csv) to the dummy CDAC of a SISA ADC. For example, the SISA ADCs of FIGS. 3A and 3B could have sampling-only capacitors added to their dummy CDACs. CIVA can be applied to a DISA, according to application (i), to the CDAC the dummy CDAC or both.

CIVA can be applied according to application (i), to a DIDA or DICA ADC, when it is applied to at least one of the two CDACs.

FIG. 5 shows one example in which CIVA is applied to a DICA according to application (i). In ADC 500, sampling capacitors 528 and 548 provide sampling-only for the positive and negative inputs, respectively. Capacitors 528 and 548 have values which are sufficiently small in comparison to Ct to keep the CMV within the CMR of comparator 504. Persons skilled in the art will realize that various other configurations of CIVA are possible, for example, capacitors 528 and 548 may instead be sampling and weighting capacitors (instead of sampling-only capacitors).

For CIVA to be applied according to application (ii), for a DIDA or a DICA, it must be applied to both CDACs of the ADC.

With regard to the bipolar operation of a DIDA, a value of y must be found for each CDAC such that each CDAC's Vsw(y) is minus one half of its max_range.

Bipolar operation of a DICA is achieved as follows. First, the max_range of the MSB CDAC is added to the max_range of the LSB CDAC to produce a total_max_range. Separate values of y (call them y1 and y2) must be found for the MSB CDAC and the LSB CDAC such that summing Vsw(y1) of the MSB CDAC with Vsw(y2) of the LSB CDAC equals minus one half of total_max_range.

With regard to the bipolar operation of DICA ADC 500, none of the input bit controlled capacitors are also used for sampling and therefore values of y can be found which yield a Vsw(y1) of the MSB CDAC and a Vsw(y2) of the LSB CDAC which sum to (−½), total_max_range.

To achieve unipolar operation of ADC 500, y is set to zero, during sampling, for both CDACs. This causes Vsw(0) to be substantially zero in increasing CDAC 510. The Vsw(0) for decreasing CDAC 512 is cancelled by an equal and opposite Vd(0).

CIVA can be applied according to application (i) or (ii), to a SIDA or a SICA, when it is applied to at least the CDAC which is connected to the analog input. CIVA can only be applied according to application (ii), to a SIDA or a SICA, when it is only applied to the CDAC whose input is grounded.

While preferred embodiments of the invention have been set forth for purposes of the disclosure, modification of these embodiments may occur to those skilled in the art. Persons skilled in the art will appreciate that the present invention can be practiced by other than the described embodiments, which are presented for purposes of illustration and not of limitation, and that the present invention is limited only by the claims which follow.

What is claimed is:

1. A circuit for converting an analog input signal to a digital output signal indicative of the magnitude of the analog input signal, the circuit comprising:

a voltage reference source for providing a reference voltage;

a scaling circuit for providing a scaled voltage;

a first CDAC, having a first analog input and an output, coupled to the reference source to receive the reference voltage and for producing a first CDAC output signal;

a second CDAC, having a second analog input and an output, coupled to the scaling circuit to receive the scaled voltage and for producing a second CDAC output signal; and a voltage comparator having a first input coupled to the output of the first CDAC and a second input coupled to the output of the second CDAC, wherein the comparator approximates the difference between the first and second CDAC output signals as a digital output signal.

2. The circuit defined in claim 1, wherein the first CDAC, second CDAC and voltage comparator are driven by control signals from a control unit which causes the approximation of the difference between the first and second analog inputs as a digital output signal according to a successive approximation procedure.

3. The circuit defined in claim 1, wherein the first CDAC, second CDAC and voltage comparator are driven by control signals from a control unit which causes first the approximation of the difference between the first and second analog inputs as a digital output signal using the first CDAC in conjunction with the voltage comparator and then causes the approximation of the difference between the first and second analog inputs as a digital output signal using the second CDAC in conjunction with the voltage comparator.

4. The circuit defined in claim 1, wherein the digital input word of the first CDAC and the digital input word of the second CDAC have the same number of bits such that the error charge injection offsets of the first and second CDACs are reduced by the common mode rejection of the voltage comparator.

5. The circuit defined in claim 1, wherein the ratio, for the first CDAC, of the total capacitance of the output node to the channel size of the transistor which connects the output node to a reference voltage during sampling, is the same as the ratio, for the second CDAC, of the total capacitance of the output node to the channel size of the transistor which connects the output node of the CDAC to a reference voltage during sampling.

6. The circuit defined in claim 1, wherein a reference voltage of the second CDAC has been scaled to a smaller magnitude with respect to a reference voltage of the first CDAC such that the second CDAC adds additional resolution to the first CDAC.

7. The circuit defined in claim 1, wherein a reference voltage of the second CDAC has been scaled to a value which is equal to the product of the following three ratios: the ratio of a reference voltage of the first CDAC to the number two raised to a power equal to the number of bits in the digital input word of the first CDAC, the ratio of the capacitance of the capacitor controlled by the most significant bit of the digital input word of the first CDAC to the total capacitance of the output node of the first CDAC, and the ratio of the total capacitance of the output node of the second CDAC to the capacitance of the capacitor controlled by the most significant bit of the digital input word of the second CDAC.

8. The circuit defined in claim 1, wherein the voltage comparator has a common mode rejection ratio, over the common mode voltage range, of sufficient value to satisfy an upper bound on the differential linearity error of the analog to digital conversion.

9. A circuit for converting an analog input signal to a digital output signal which is indicative of the magnitude of the analog input signal, the digital signal including a plurality of bits grouped into a first group of M more significant bits and a second group of L less significant bits, the circuit comprising:

a voltage reference source for providing a reference voltage;

a scaling circuit for providing a scaled voltage;

a first CDAC, having a first analog input and an output, coupled to the reference source to receive the reference voltage and for producing a first CDAC output signal;

a second CDAC, having a second analog input and an output, coupled to the scaling circuit to receive the scaled voltage and for producing a second CDAC output signal; and a voltage comparator having a first input coupled to the output of the first CDAC and a second input coupled to the output of the second CDAC, wherein the comparator approximates the difference between the first and second CDAC output signals as a digital output signal.

10. The circuit defined in claim 9, wherein the first CDAC, second CDAC and voltage comparator are driven by control signals from a control unit which causes the approximation of the difference between the first and second analog inputs as a digital output signal according to a successive approximation procedure.

11. The circuit defined in claim 9, wherein the first CDAC, second CDAC and voltage comparator are driven by control signals from a control unit which causes first the approximation of the difference between the first and second analog inputs as a digital output signal using the first CDAC in conjunction with the voltage comparator and then causes the approximation of the difference between the first and second analog inputs as a digital output signal using the second CDAC in conjunction with the voltage comparator.

12. The circuit defined in claim 9, wherein the digital input word of the first CDAC and the digital input word of the second CDAC have the same number of bits such that the error charge injection offsets of the first and second CDACs are reduced by the common mode rejection of the voltage comparator.

13. The circuit defined in claim 9, wherein the ratio, for the first CDAC, of the total capacitance of the output node to the channel size of the transistor which connects the output node to a reference voltage during sampling, is the same as the ratio, for the second CDAC, of the total capacitance of the output node to the channel size of the transistor which connects the output node of the CDAC to a reference voltage during sampling.

14. The circuit defined in claim 9, wherein a reference voltage of the second CDAC has been scaled to a smaller magnitude with respect to a reference voltage of the first CDAC such that the second CDAC adds additional resolution to the first CDAC.

15. The circuit defined in claim 9, wherein a reference voltage of the second CDAC has been scaled to a value which is equal to the product of the following three ratios: the ratio of a reference voltage of the first CDAC to the number two raised to a power equal to the number of bits in the digital input word of the first CDAC, the ratio of capacitance of the capacitor controlled by the most significant bit of the digital input word of the first CDAC to the total capacitance of the output node of the first CDAC, and the ratio of the total capacitance of the output node of the second CDAC to the capacitance of the capacitor controlled by the most significant bit of the digital input word of the second CDAC.

16. The circuit defined in claim 9, wherein the voltage comparator has a common mode rejection ratio, over the common mode voltage range, of sufficient value to satisfy an upper bound on the differential linearity error of the analog to digital conversion.

17. The circuit defined in claim 9, wherein a reference voltage of said second CDAC has been scaled to a smaller magnitude with respect to a reference voltage of said first CDAC such that the second CDAC adds an additional resolution, in the amount of said second bit group, to the first CDAC wherein the first CDAC has a resolution in the amount of said first bit group.

18. The circuit defined in claim 9, wherein a the first CDAC, second CDAC and voltage comparator are driven by control signals from a control unit which causes first the approximation of the difference between the first and second analog inputs as a digital output signal, for the first bit group, using the first CDAC in conjunction with the voltage comparator and then causes the approximation of the difference between the first and second analog inputs, as a digital output value for the second bit group, using the second CDAC in conjunction with the voltage comparator.

19. A method for converting an analog input signal to a digital output signal, digital signal having at least two bits, which is indicative of the magnitude of the analog input signal, the method comprising the steps of:

acquiring a first acquisition voltage which is proportional to a first sampled input voltage;

acquiring a second acquisition voltage which is proportional to a second sampled input voltage;

adding a first predetermined weighting voltage, which is selected from a first set of predetermined weighting voltages, to the first acquisition voltage to produce a first summed voltage;

comparing the relative values of the first summed voltage and the second acquisition voltage;

determining the value of one of the bits of the digital output signal based upon the step of comparing, wherein the value is one of a logical zero and a logical one;

subtracting the first predetermined weighting voltage from the first summed voltage if the value of the bit is a logical zero;

repeating the steps of adding a first predetermined weighting voltage, comparing the relative values of the first summed voltage and the second acquisition voltage, determining, and subtracting the first predetermined weighting voltage, for each predetermined weighting voltage of the first set of predetermined weighting voltages;

adding a second predetermined weighting voltage, which is selected from a second set of predetermined weighting voltages, to the second acquisition voltage to produce a second summed voltage;

comparing the relative values of the second summed voltage and the first summed voltage;

determining the value of one of the bits of the digital output signal based upon the step of comparing, wherein the value is one of a logical zero and a logical one;

subtracting the second predetermined weighting voltage from the second summed voltage if the value of the bit is a logical zero; and repeating the steps of adding a second predetermined weighting voltage, comparing the relative values of the second summed voltage and the first summed voltage, determining, and subtracting the second predetermined weighting voltage, for each predetermined weighting voltage of the second set of predetermined weighting voltages.

20. A circuit for converting an analog input signal to a digital output signal indicative of the magnitude of the analog input signal, the circuit comprising:

a first CDAC, having a first analog input and producing a first CDAC output signal;

a second CDAC, having a second analog input and producing a second CDAC output signal;

a voltage comparator having a first input coupled to the output of the first CDAC and a second input coupled to the output of the second CDAC, wherein the comparator approximates the difference between the first and second CDAC output signals as a digital output signal; and wherein at least one of the first and second CDACs samples its analog input with a capacitance which is less than the total capacitance of the CDAC's capacitor array.

21. A circuit for converting an analog input signal to a digital output signal indicative of the magnitude of the analog input signal, the circuit comprising:

a CDAC, having a first analog input and producing a CDAC output signal;

a dummy CDAC, having a second analog input and producing a dummy CDAC output signal;

a voltage comparator having a first input coupled to the output of the CDAC and a second input coupled to the output of the dummy CDAC, wherein the comparator approximates the difference between the CDAC and the dummy CDAC output signals as a digital output signal; and wherein at least the dummy CDAC samples its analog input with a capacitance which is less than the total capacitance of the dummy CDAC's capacitor array.

22. A circuit for converting an analog input signal to a digital output signal indicative of the magnitude of the analog input signal, the circuit comprising:

a voltage reference source for providing a reference voltage;

a scaling circuit for providing a scaled voltage;

an m-bit CDAC that is split into a first CDAC section and a second CDAC section;

the first CDAC section having m/2-bits, having a first analog input and an output, coupled to the reference source to receive the reference voltage and for producing a first CDAC output signal;

the second CDAC section having m/2-bits, having a second analog input and an output, coupled to the scaling circuit to receive the scaled voltage and for producing a second CDAC output signal; and a voltage comparator having a first input coupled to the output of the first CDAC section and a second input coupled to the output of the second CDAC section, wherein the comparator approximates the difference between the first and second CDAC section output signals as a digital output signal.

* * * * *